US012664047B2

(12) United States Patent　　　(10) Patent No.:　US 12,664,047 B2

Kitagata　　　　　　　　　　　　　(45) Date of Patent:　Jun. 23, 2026

(54) SEMICONDUCTOR DEVICE

(71) Applicant: Renesas Electronics Corporation, Tokyo (JP)

(72) Inventor: Daiki Kitagata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 18/928,308

(22) Filed: Oct. 28, 2024

(65) Prior Publication Data

US 2025/0190301 A1　　Jun. 12, 2025

(30) Foreign Application Priority Data

Dec. 7, 2023　(JP) ................................. 2023-206855

(51) Int. Cl.
| | |
|---|---|
| *G06F 11/10* | (2006.01) |
| *G11C 7/10* | (2006.01) |
| *G11C 8/06* | (2006.01) |
| *G11C 29/42* | (2006.01) |
| *H03K 19/17704* | (2020.01) |
| *H03K 19/17728* | (2020.01) |
| *H03K 19/1776* | (2020.01) |
| *H03K 19/20* | (2006.01) |

(52) U.S. Cl.
CPC ........ *G06F 11/1048* (2013.01); *G11C 7/1015* (2013.01); *G11C 8/06* (2013.01); *G11C 29/42* (2013.01); *H03K 19/17704* (2013.01); *H03K 19/17728* (2013.01); *H03K 19/1776* (2013.01); *H03K 19/20* (2013.01)

(58) Field of Classification Search
CPC ................ G06F 11/1048; G11C 29/42; G11C 2029/0411; G11C 7/1015; G11C 8/06; H03K 19/17704; H03K 19/17728; H03K 19/1776; H03K 19/20
USPC .......... 365/154, 52, 200, 201; 714/718, 702, 714/6.24, 754, 768; 326/38
See application file for complete search history.

(56) References Cited

U.S. PATENT DOCUMENTS

| | | | | |
|---|---|---|---|---|
| 7,447,950 | B2 * | 11/2008 | Takahashi ............ | G11C 7/1006 365/201 |
| 7,552,378 | B2 | 6/2009 | Kawagoe et al. | |
| 2014/0380117 | A1 * | 12/2014 | Hirano ................... | G11C 29/78 714/758 |
| 2023/0126954 | A1 * | 4/2023 | Lee .................... | G11C 29/4401 711/154 |

FOREIGN PATENT DOCUMENTS

JP　　　　2006-14156 A　　　1/2006

* cited by examiner

*Primary Examiner* — Arnold M Kinkead
(74) *Attorney, Agent, or Firm* — Rimon P.C.

(57) ABSTRACT

A semiconductor device includes a semiconductor chip in which a plurality of circuit blocks is formed. The plurality of circuit blocks includes a plurality of logic circuits. Each of the plurality of logic circuits includes an inverter circuit. The inverter circuit outputs a signal according to the result of a logical operation of a first signal and a second signal after being precharged by a trigger signal.

16 Claims, 20 Drawing Sheets

| A | B | CB | C |
|---|---|----|---|
| 0 | 0 | 0 | 1 |
| 0 | 1 | 1 | 0 |
| 1 | 0 | 1 | 0 |
| 1 | 1 | 0 | 1 |

SEMICONDUCTOR DEVICE

CROSS-REFERENCE TO RELATED APPLICATIONS

The disclosure of Japanese Patent Application No. 2023-206855 filed on Dec. 7, 2023, including the specification, drawings and abstract is incorporated herein by reference in its entirety.

BACKGROUND

The present invention relates to a semiconductor device, for example, a semiconductor device equipped with an exclusive OR circuit (hereinafter, also referred to as an XOR circuit).

A semiconductor device is increasingly becoming more highly integrated. As the degree of integration increases, the probability of soft errors occurring due to radiation such as alpha rays become higher. For instance, in the case where a semiconductor device is equipped with memory, it is feared that data stored in the memory may be altered (destroyed) by soft errors, leading to a decrease in the reliability of the stored data.

There are disclosed techniques listed below. [Patent Document 1] Japanese Unexamined Patent Application Publication No. 2006-14156

In order to improve the reliability of stored data, it is practiced providing a semiconductor device with an ECC (Error Correcting Code) circuit. In this case, the ECC circuit can detect the destruction of stored data and further correct the destroyed data, thereby improving the reliability of the stored data.

SUMMARY

The ECC circuit is composed of many XOR circuits. An example of an XOR circuit is shown in FIG. 7 of Patent Document 1. In Patent Document 1, a 2-input XOR circuit (for example, logic unit 20 in FIG. 7) is composed of two parallel-connected P-channel series circuits between the output terminal (node NO) and the power supply voltage (VCC), and two parallel-connected N-channel series circuits between the output terminal (NO) and the ground voltage (GND).

Herein, each of the two P-channel type serial circuits is composed of two P-channel type field-effect transistors (hereinafter, referred to as PMOSFET or P-type MOS transistor) where an input signal is supplied to the gate electrode, and the source-drain path is serially connected. Similarly, each of the two N-channel type serial circuits is composed of two N-channel type field-effect transistors (hereinafter, referred to as NMOSFET or N-type MOS transistor) where an input signal is supplied to the gate electrode, and the source-drain path is serially connected. In this specification, when referring to both P-type MOS transistors and N-type MOS transistors collectively, they are simply referred to as MOSFET or MOS transistor.

In the case where the logical values of the two inputs of the XOR circuit match, one of the two N-channel type serial circuits becomes conductive, and in the case of a mismatch, one of the two P-channel type serial circuits becomes conductive. Thus, the exclusive logical sum of the two inputs is realized.

However, to realize a two-input XOR circuit, 8 MOS transistors are required. Furthermore, as shown in FIG. 7 of Patent Document 1, two inverter circuits are required to generate the inputs of the XOR circuit (20). Since one inverter circuit can be realized with, for example, two MOS transistors, an additional 4 MOS transistors are required. As a result, to realize a two-input XOR circuit, 12 MOS transistors are required, which presents a problem of increased occupied area of the ECC circuit.

A brief overview of a representative embodiment disclosed in this application is as follows.

That is, a semiconductor device according to an embodiment comprises a semiconductor chip on which multiple circuit blocks are formed.

Herein, a plurality of circuit blocks is provided with a memory, a first input circuit for outputting signals, a plurality of logic circuits, a first processing circuit for processing signals from the first input circuit, and a first output circuit for supplying the output of the first processing circuit to the memory.

Furthermore, each of the plurality of logic circuits comprises a first terminal, a second terminal, and a first gate terminal for controlling conduction between the first and second terminals, wherein a first signal from the first input circuit is supplied to the first terminal, and a second signal from the first input circuit is supplied to the first gate terminal of a first N-type MOS transistor, and a second N-type MOS transistor comprising a third terminal, a fourth terminal, and a second gate terminal for controlling conduction between the third and fourth terminals, wherein the second signal is supplied to the third terminal, and the first signal is supplied to the second gate terminal, and an output driver comprising an input terminal connected to the second terminal of the first N-type MOS transistor and the fourth terminal of the second N-type MOS transistor, and a first P-type MOS transistor connected between the input terminal of the output driver and a predetermined voltage, which precharges the input terminal of the output driver with a voltage based on the predetermined voltage in response to a first trigger signal supplied to the gate terminal, and the output driver outputs a signal according to the result of a logical operation of the first and second signals after being precharged by the first trigger signal.

Other objects and novel features will become apparent from the description of this specification and the accompanying drawings.

According to one embodiment, it is possible to provide a semiconductor device that can suppress an increase in occupied area.

BRIEF DESCRIPTION OF THE DRAWINGS

FIG. 1 is a block diagram showing the configuration of a semiconductor device according to the first embodiment.

FIG. 7 is a circuit diagram showing an example of an input circuit and a processing circuit according to the first embodiment.

FIGS. 12A and 12B are diagrams for explaining a unit logic circuit according to the second modified example of the first embodiment.

DETAILED DESCRIPTION

Figure 2:
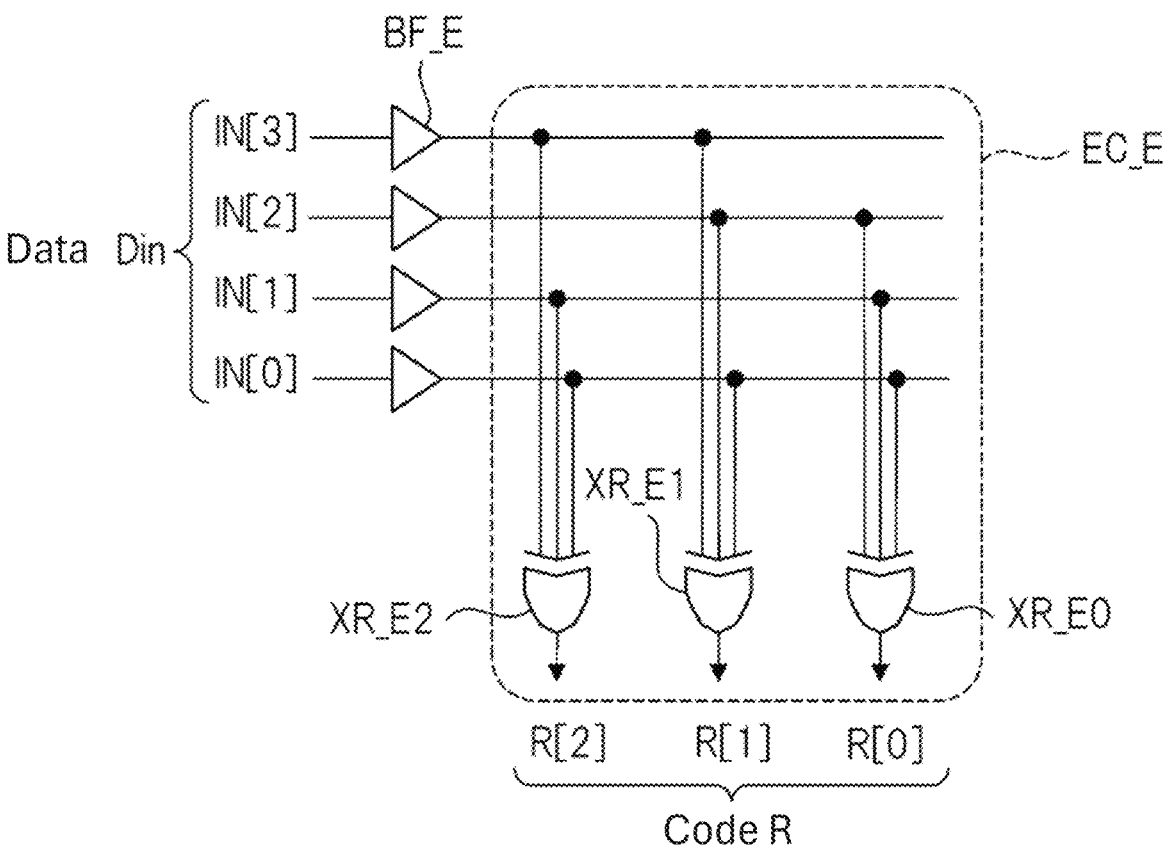
FIG. 2 is a block diagram showing an example of an encoder according to the first embodiment.

Hereinafter, embodiments of the present invention will be described with reference to the drawings. It should be noted that the disclosure is merely an example, and it is naturally included in the scope of the present invention that those skilled in the art can easily think of appropriate changes while keeping the spirit of the invention.

Furthermore, in this specification and the drawings, the same reference numerals are assigned to the same elements as those described previously regarding the already presented drawings, and detailed descriptions thereof may be omitted as appropriate.

(First Embodiment)<Configuration of Semiconductor Device>

Figure 1:
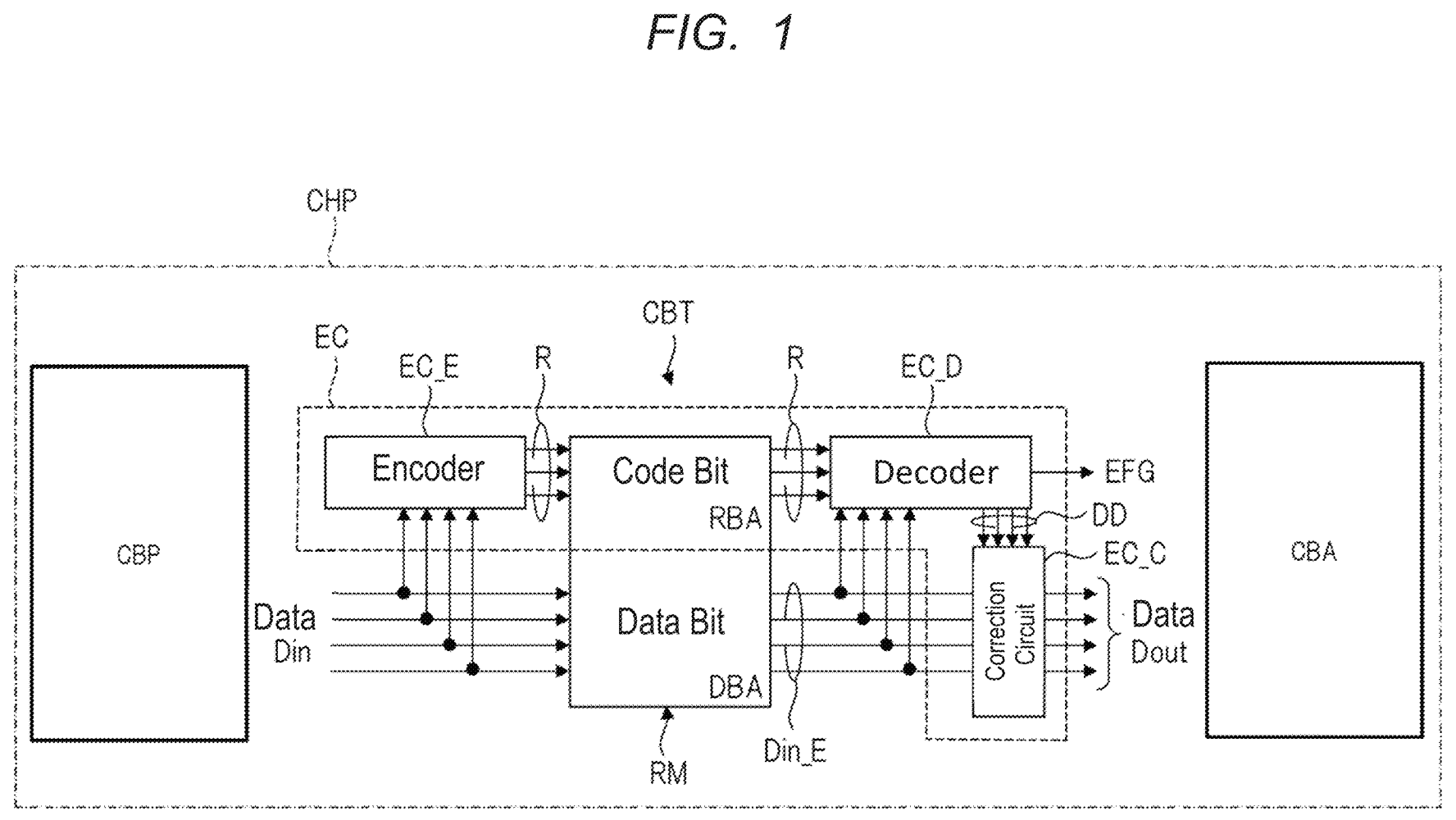

FIG. 1 is a block diagram showing the configuration of a semiconductor device according to the first embodiment. The semiconductor device according to the first embodiment includes a single semiconductor chip formed by well-known semiconductor manufacturing technology, on which multiple circuit blocks are formed. In FIG. 1, CHP indicated by a dashed line represents the semiconductor chip on which multiple circuit blocks are formed. Although various circuit blocks are formed as multiple circuit blocks on the semiconductor chip CHP, only the circuit blocks necessary for the explanation are depicted in FIG. 1 to avoid complicating the drawing.

In FIG. 1, CBT represents a memory equipped with an ECC circuit. Additionally, CBP represents a front-end circuit that supplies a signal (data Din) to the memory CBT, and CBA represents a back-end circuit to which a signal (data Dout) is supplied from the memory CBT. The front-end circuit CBP is, for example, composed of a processor, and the data Din generated by the processor is supplied to and written into the memory CBT. The data Dout read from the memory CBT is supplied to, for example, a back-end circuit such as peripheral circuits CBA, where it is processed.

The memory CBT, which is not particularly limited, includes a single memory RM and an ECC circuit EC. The single memory RM according to the first embodiment includes two storage areas DBA and RBA. The storage area DBA is a data bit area where the data Din generated by the front-end circuit CBP is written. The storage area RBA is a code bit area where a code (error correction code) generated by the ECC circuit EC described later is written.

During the read and write operations of the memory RM, for example, the front-end circuit CBP generates an address signal to access the memory RM. The generated address signal accesses predetermined areas (address areas specified by the address signal) in each of the two storage areas DBA and RBA. During writing, data Din is written into a predetermined area of the storage area DBA, and a code R generated by the ECC circuit EC is written into a predetermined area of the storage area RBA.

During reading, data (bits) stored in a predetermined area of the storage area DBA is read out as data Din_E and supplied to the ECC circuit EC. Also, during reading, data (code) stored in a predetermined area of the storage area RBA is read out as code R and supplied to the ECC circuit EC. The ECC circuit EC uses the supplied data Din_E and code R to detect whether there is an error in the data Din_E read from the storage area DBA and outputs the detection results as an error flag EFG. If, in this detection, a correctable error is detected, the ECC circuit EC corrects the error in the data Din_E and outputs it as data Dout to the subsequent circuit CBA.

Although not particularly limited, the error flag EFG is supplied to the processor, which is the preceding circuit CBP. Consequently, the processor can detect the occurrence of errors that cannot be corrected by the ECC circuit EC, for example, based on the error flag EFG.

It should be noted that, in the following description, a static volatile memory (SRAM) is described as an example of the memory RM, but the invention is not limited to this. For example, the memory RM may be a dynamic volatile memory (DRAM), an electrically rewritable non-volatile memory (such as flash memory), or MRAM.

<<Overview of ECC Circuit>>

Next, an overview of the ECC circuit EC will be described using FIG. 1. As shown in FIG. 1, the ECC circuit EC includes an encoder EC_E, a decoder EC_D, and a correction processing circuit (hereinafter, also referred to as a correction circuit) EC_C.

As will be shown later using drawings, data Din to be written into the memory RM is supplied to the encoder EC_E. The encoder EC_E encodes the supplied data Din to generate a code R and writes the generated code R into storage area RBA.

The decoder EC_D is supplied with the code R read from the storage area RBA and the data Din_E read from the storage area DBA. The decoder EC_D decodes these supplied data, detects whether an error has occurred, and if an error has occurred, notifies it with the error flag EFG. Furthermore, the decoder EC_D identifies the location of the error in the data Din_E if a correctable error has occurred.

The correction circuit EC_C is supplied with the data Din_E read from the storage area DBA and the data DD identifying the location of the error, and if a correctable error has occurred, corrects the error and outputs it as data Dout.

Next, an example of the configuration of the encoder EC_E, the decoder EC_D, and the correction circuit EC_C will be described using drawings. For ease of explanation, a case where the data Din supplied from the preceding circuit CBP to the memory RM consists of 4 bits IN [0] to IN [3](parallel 4 bits) is described as an example. Of course, the number of bits in the data Din is not limited to this.

<<<Overview of Encoder EC_E>>>

FIG. 2 is a block diagram showing an example of an encoder according to the first embodiment. The encoder EC_E includes three 3-input XOR circuits XR_E0 to XR_E2. In the 4 bits IN [0] to IN [3] constituting the data Din, as shown in FIG. 2, the data Din is supplied to the corresponding 3-input XOR circuits XR_E0 to XR_E2 with different combinations of 3 bits. For example, the XOR circuit XR_E0 is supplied with the data Din with a combination of bits IN [0], IN [1], and IN [2]. Similarly, 3 bits of the data Din are input to the XOR circuits XR_E1 and XR_E2. The outputs of the three 3-input XOR circuits XR_E0 to XR_E2 are output from the decoder EC_D to the memory area RBA of the memory RM as bits R [0] to R [2] constituting the code R.

While not particularly limited, in the encoder EC_E according to the first embodiment, a buffer circuit BF_E is provided in front of the encoder, and through the buffer circuit BF_E, data Din is supplied from the preceding circuit CBP (shown in FIG. 1). Of course, it is not necessary to provide the buffer circuit BF_E.

The encoder EC_E generates a code R, which is composed of bits R [0] to R [2] having logical values according to the combination of logical values of bits IN [0] to IN [3] that constitute the data Din, and the generated code is written into the storage area RBA of the memory RM.

<<<Overview of the Decoder EC_D and the Correction Circuit EC_C>>>

Figure 3:
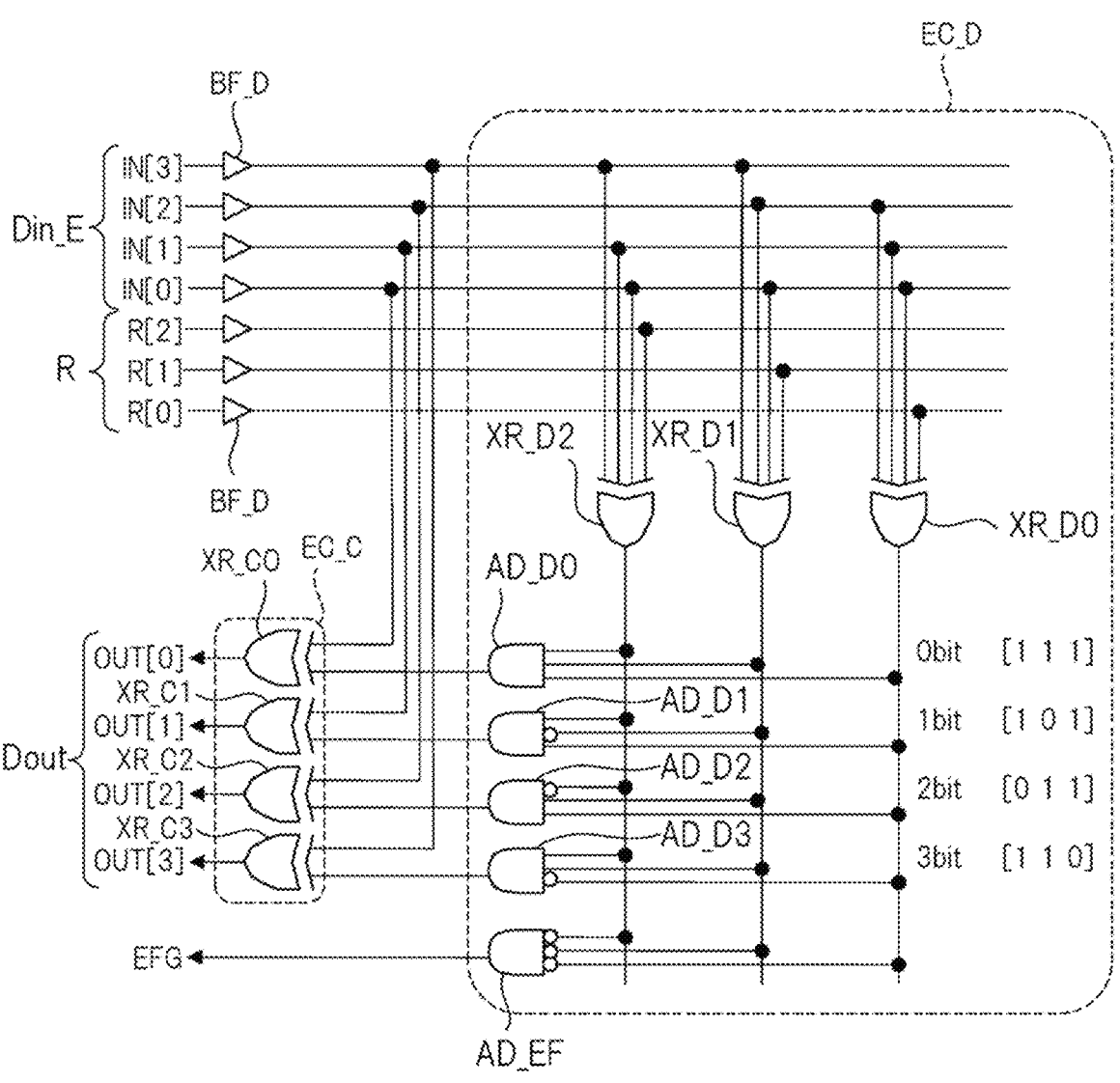
FIG. 3 is a block diagram showing an example of a decoder and a correction circuit according to the first embodiment.

FIG. 3 is a block diagram showing an example of a decoder and a correction circuit according to the first embodiment. As shown in FIG. 3, the decoder EC_D includes three 4-input XOR circuits XR_D0 to XR_D2 and five 3-input AND circuits AD_D0 to AD_D3 and AD_EF.

The four bits IN [0] to IN [3] constituting the data Din_E read from the storage area DBA of the memory RM shown in FIG. 1 and the three bits R [0] to R [2] constituting the code R read from the storage area RBA are supplied to the 4-input XOR circuits XR_D0 to XR_D2 in different combinations as shown in FIG. 3. For example, bits IN [0] to IN [2] and bit R [0] are input to the 4-input XOR circuit XR_D0, and bits IN [0], IN [1], IN [3], and bit R [2] are input to the 4-input XOR circuit XR_D2.

The outputs of the XOR circuits XR_D0 to XR_D2 are supplied to the 3-input AND circuits AD_D0 to AD_D3 and AD_EF. The circles drawn on the input side of the 3-input AND circuits AD_D1 to AD_D3 and AD_EF indicate inversion. That is, at the parts marked with circles, the supplied data is inverted before being input to the AND circuits. As shown in FIG. 3, in the 3-input AND circuits AD_D1 to AD_D3, the outputs from different XOR circuits are inverted (marked with circles) before being input.

For example, in the 3-input AND circuit AD_D1 corresponding to the first bit of the data Din, the output from the XOR circuit XR_D1 is inverted before being input. Conversely, in the 3-input AND circuit AD_D2 corresponding to the second bit of the data Din, the output from the XOR circuit XR_D2 is inverted before being input.

In the 3-input AND circuit AD_D0 corresponding to the zeroth bit of the data Din, all outputs from the XOR circuits XR_D0 to XR_D2 are input without being inverted. In the 3-input AND circuit AD_EF corresponding to the error flag, all outputs from the XOR circuits XR_D0 to XR_D2 are inverted before being input.

The correction circuit EC_C comprises 2-input XOR circuits XR_C0 to XR_C3 corresponding to bits IN [0] to IN [3] of the data Din. For the XOR circuit XR_C0 corresponding to the 0th bit of the data Din, the output of the 3-input AND circuit AD_D0 corresponding to the 0th bit and the bit IN [0] are supplied. Similarly, for the XOR circuit XR_C1 corresponding to the 1st bit of the data Din, the output of the 3-input AND circuit AD_D1 corresponding to the 1st bit and the bit IN [1] are supplied. Furthermore, for the XOR circuit XR C2 corresponding to the 2nd bit of the data Din, the output of the 3-input AND circuit AD D2 corresponding to the 2nd bit and the bit IN [2] are supplied. Likewise, for the XOR circuit XR_C3 corresponding to the 3rd bit of the data Din, the output of the 3-input AND circuit AD_D3 corresponding to the 3rd bit and the bit IN [3] are supplied. The outputs of the XOR circuits XR_C0 to XR_C3 are output as the data Dout from the correction circuit EC_C. Additionally, the output of the 3-input AND circuit AD_EF becomes the error flag EFG.

In the data Din_E read from the memory RM, if, for example, one bit (for example, bit IN [1] in FIG. 3) has its logical value inverted due to a soft error, the decoder EC_D uses the read data Din_E and the code R to identify the position of the bit whose logical value has been inverted (the 1st bit corresponding to bit IN [1]). The correction circuit EC_C corrects (corrects by inversion) the logical value of the bit at the position identified by the decoder EC_D. At this time, the decoder EC_D notifies the occurrence of an error through the error flag EFG.

Although not particularly limited, in the first embodiment, each bit of the data Din_E and each bit of the code R are supplied to the decoder EC_D and the correction circuit EC_C through the buffer circuit BF_D, similarly to the encoder EC_E shown in FIG. 2. Of course, this buffer circuit BF_D may not be provided.

As shown in FIGS. 2 and 3, many XOR circuits are used in the ECC circuit EC. Therefore, if the number of elements constituting the XOR circuits is large, the occupied area of the ECC circuit EC becomes large. In the first embodiment, an XOR circuit that can be constituted with a smaller number of elements is provided. This makes it possible to suppress an increase in the occupied area of the ECC circuit.

<<Specific Example of ECC Circuit>>

Next, a specific example of the configuration of the ECC circuit according to the first embodiment will be explained using the drawings. The following description will be divided into parts corresponding to the encoder EC_E and parts corresponding to the decoder EC_D and the correction circuit EC_C.

<<Encoder EC_E Corresponding Part>>

Figure 4:
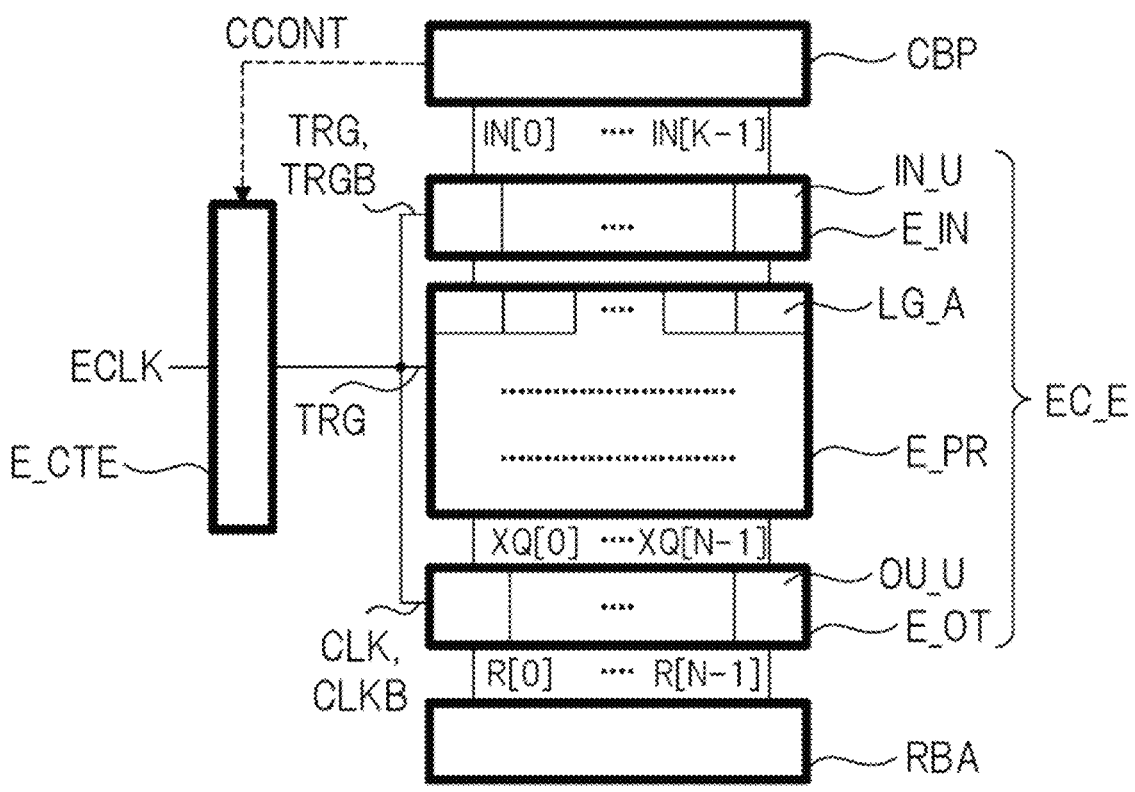
FIG. 4 is a block diagram showing an example of an ECC circuit according to the first embodiment.

FIG. 4 is a block diagram showing an example of the ECC circuit according to the first embodiment. This figure mainly shows the part corresponding to the encoder EC_E described in FIG. 1. In FIG. 4, CBP and RBA correspond to the pre-stage circuit CBP, and the storage area of the memory RM shown in FIG. 1. The encoder EC_E comprises an input circuit (first input circuit) E_IN, a processing circuit (first processing circuit) E_PR, an output circuit (first output circuit) E_OT, and a control circuit (first control circuit) E_CTE.

Bits IN [0] to IN [K−1] constituting data Din output from the preceding circuit CBP are input to the input circuit E_IN, and the input circuit E_IN outputs data (signal) corresponding to the input data to the processing circuit E_PR.

The processing circuit E_PR includes a plurality of logic circuits (hereinafter, also referred to as unit logic circuits) LG_A. The plurality of logic circuits LG_A are not particularly limited, but in the first embodiment, they have similar configurations to each other. A detailed explanation will be omitted here since an example of the unit logic circuit LG_A will be described later using FIG. 5, etc., but by connecting a plurality of unit logic circuits LG_A, a plurality of multi-input logic circuits with three or more inputs (for example, the XOR circuits XR_E0 to XR_E2 shown in FIG. 2) are realized. Logical operations are performed by the logic circuits realized by the plurality of unit logic circuits LG_A in the processing circuit E_PR on the data (signal) from the input circuit E_IN. The result of the logical operation performed in the processing circuit E_PR is output to the output circuit E_OT as bits XQ [0] to XQ [N−1] constituting a code.

The control circuit E_CTE receives an external clock signal ECLK and generates a timing signal to control the input circuit E_IN, the processing circuit E_PR, and the output circuit E_OT. That is, the control circuit E_CTE generates a trigger signal TRG synchronized with the external clock signal ECLK and an inverted trigger signal TRGB phase-inverted with respect to the trigger signal TRG, and supplies them to the input circuit IN_U, as well as supplying the trigger signal TRG to the processing circuit E_PR. Furthermore, the control circuit E_CTE supplies the output circuit E_OT with a clock signal CLK synchronized with the external clock signal ECLK and an inverted clock signal CLKB phase-inverted with respect to the clock signal CLK. The input circuit IN_U, the processing circuit E_PR, and the output circuit E_OT operate in accordance with the timing signals (TRG, TRGB, CLK, CLKB) supplied from the control circuit E_CTE. The external clock signal ECLK supplied to the control circuit E_CTE is not particularly limited but is generated by a circuit block (not shown) such as a control circuit formed on a semiconductor chip CHP (FIG. 1).

The timing signal CCONT indicated by the dashed line will be described later in the first modified example, so it is omitted here.

<<<Example of Logic Circuit LG_A>>>

Figure 5:
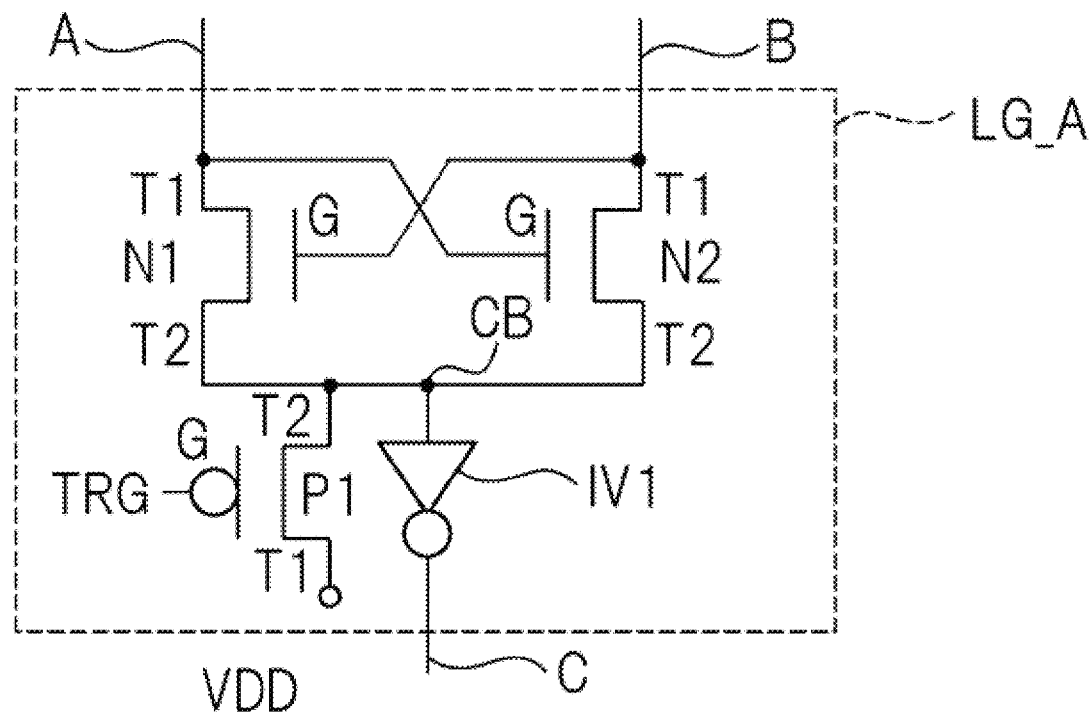
FIG. 5 is a circuit diagram showing the configuration of a unit logic circuit according to the first embodiment.

FIG. 5 is a circuit diagram showing the configuration of a unit logic circuit according to the first embodiment. The unit logic circuit LG_A includes two N-type MOS transistors (first N-type MOS transistor, second N-type MOS transistor) N1, N2, one P-type MOS transistor (first P-type MOS transistor) P1, and an inverter circuit (output driver) IV1. Each MOS transistor is equipped with a first terminal T1 and a second terminal T2, and a gate terminal G that controls the conduction between the first terminal T1 and the second terminal T2. It should be noted that the first terminal T1 and the second terminal T2 correspond to the source terminal and the drain terminal of the MOS transistor, respectively. However, since the source terminal and the drain terminal are determined by the voltage at the terminal, this specification does not specifically illustrate the source terminal and the drain terminal if there is no need to do so and describes them as the first terminal and the second terminal. Furthermore, to avoid complexity in the drawings, the symbols T1, T2, and G are principally omitted in the subsequent drawings.

The first terminal T1 of the N-type MOS transistor N1 is connected to the input terminal A of the unit logic circuit LG_A and the gate terminal G of the N-type MOS transistor N2, and the first terminal T1 of the N-type MOS transistor N2 is connected to the input terminal B of the unit logic circuit LG_A and the gate terminal G of the N-type MOS transistor N1. Moreover, the second terminal T2 of the N-type MOS transistors N1 and N2 is connected to the composite node CB, and the input terminal of the inverter circuit IV1 and the second terminal T2 of the P-type MOS transistor P1 are also connected to the composite node CB. Furthermore, the first terminal T1 of the P-type MOS transistor P1 is connected to the power supply voltage (a predetermined voltage) VDD, the gate terminal G of the P-type MOS transistor P1 is supplied with a trigger signal (first trigger signal) TRG, and the output terminal of the inverter circuit IV1 is connected to the output terminal C of the unit logic circuit LG_A.

When the P-type MOS transistor P1 is turned on by the trigger signal TRG, the composite node CB is connected to the power supply voltage VDD through the P-type MOS transistor P1. As a result, the composite node CB, including the input terminal of the inverter circuit IV1, is precharged with a voltage based on the power supply voltage VDD. Binary logic signals (first signal and second signal) are supplied to the input terminals A and B. During the processing period (logic operation period) after the precharge period, the unit logic circuit LG_A performs a logic operation (exclusive or operation in FIG. 5) between the first signal and the second signal, and outputs an output signal corresponding to the result of the logic operation from the output terminal C.

<<<Operation Example of Logic Circuit LG_A>>>

Figure 6:
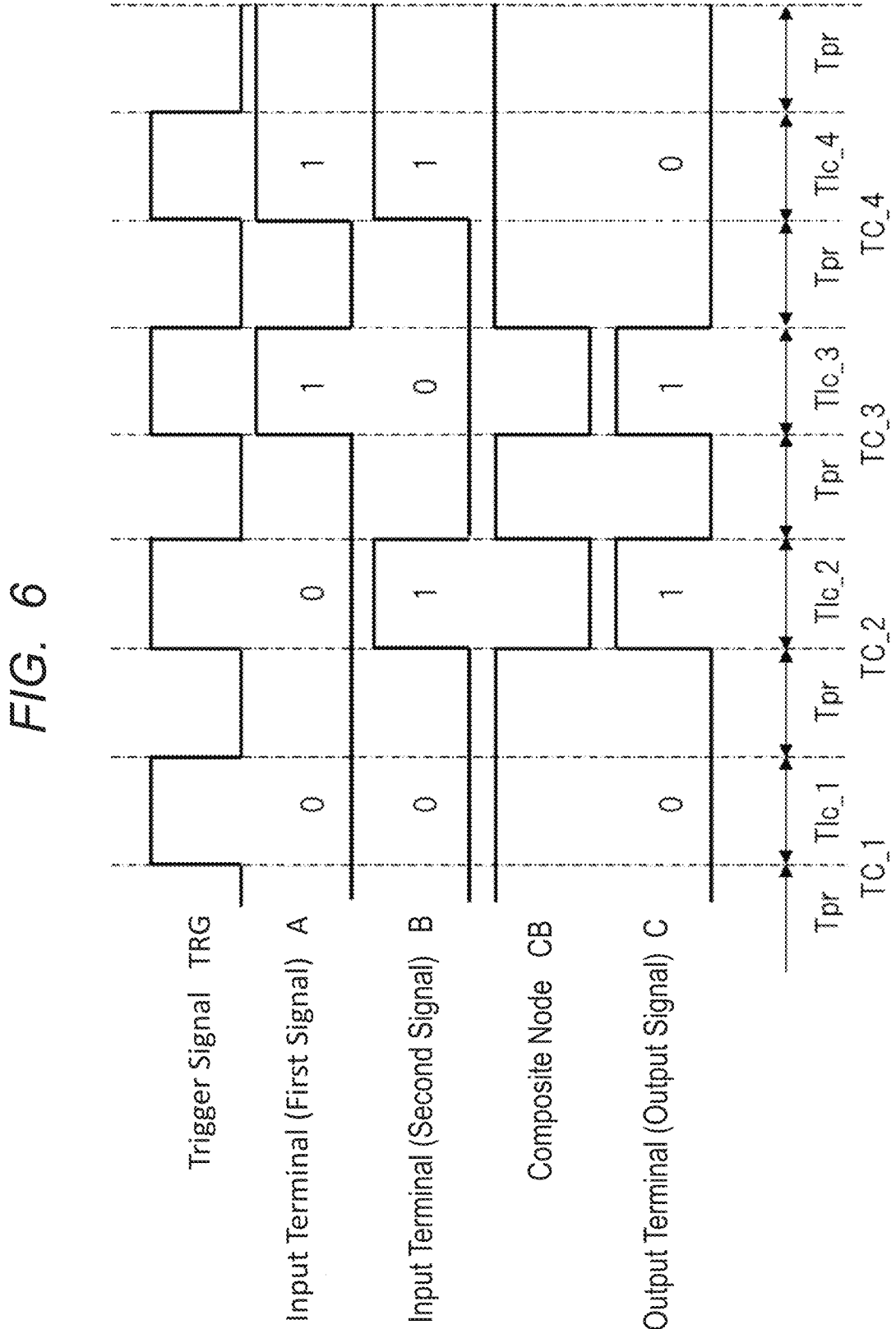
FIG. 6 is a timing diagram for explaining the operation of a unit logic circuit according to the first embodiment.

FIG. 6 is a timing diagram for explaining the operation of a unit logic circuit according to the first embodiment. Using FIGS. 5 and 6, the operation of the unit logic circuit LG_A, that is, the operation of the exclusive OR, is explained.

The period during which the trigger signal TRG is at a low level is the precharge period Tpr, and the period during which the trigger signal TRG is at a high level is the processing period Tlc. The control circuit E_CTE shown in FIG. 4 outputs the trigger signal TRG, which periodically changes to high/low levels in synchronization with the external clock signal ECLK.

During the precharge period Tpr before the calculation start time TC_1, the trigger signal TRG becomes low level. Also, during the precharge period Tpr, a logic value 0 input signal (first signal) is supplied to the input terminal A, and a logic value 0 input signal (second signal) is also supplied to the input terminal B. As a result, the P-type MOS transistor P1 turns on, and the N-type MOS transistors N1 and N2 turn off, and the composite node CB is precharged with a voltage (high level) based on the power supply voltage VDD. Because the composite node CB is precharged to a high level, a low-level output signal will be output from the output terminal C. This precharge period Tpr can be considered as the initialization period of the logic circuit LG_A. When considered as the initialization period, the logic circuit LG_A is supplied with the first and second signals of logic value 0 at initialization, and the logic circuit LG_A outputs an output signal of logic value 0.

During the calculation start time TC_1 and the subsequent processing period Tlc_1, the trigger signal TRG becomes high level, and the first and second signals to be used for logical operations are supplied to the input terminals A and B. In response to the high level of the trigger signal TRG, the P-type MOS transistor P1 turns off. In the example of FIG. 6, the first and second signals are at a low level during the calculation start time TC_1 and the processing period Tlc_1. Because the low level is supplied to the gate terminals G of the N-type MOS transistors N1 and N2, both N-type MOS transistors N1 and N2 remain off. As a result, during the processing period Tlc_1, the composite node CB maintains the precharged voltage, and the output terminal C continues to output an output signal of logic value 0.

During the precharge period Tpr following the processing period Tlc_1, the trigger signal TRG becomes low level again, and the composite node CB is precharged. At this time, the first signal and the second signal at the time of initialization (logical value 0) are supplied to input terminals A and B. At the start time TC_2 and during the processing period Tlc_2, the first signal with a logical value of 0 and the second signal with a logical value of 1 are supplied to input terminals A and B. As a result, the voltage at input terminal B becomes high level, and the voltage at input terminal A becomes low level. Consequently, the N-type MOS transistor N1 changes to the on state, and the charge precharged at the composite node CB is discharged to the ground voltage VSS through the N-type MOS transistor N1, resulting in a high-level output signal being output from output terminal C. It should be noted that, at this time, the N-type MOS transistor N2 remains in the off state.

During the precharge period Tpr following the processing period Tlc_2, the trigger signal TRG becomes low level again, and the composite node CB is precharged. Also, at this time, the first and second signals at the time of initialization are supplied to input terminals A and B. At the start time TC_3 and during the processing period Tlc_3, the first signal with a logical value of 1 and the second signal with a logical value of 0 are supplied to input terminals A and B. As a result, the voltage at input terminal A becomes high level, and the voltage at input terminal B becomes low level. Consequently, the N-type MOS transistor N2 changes to the on state, and the charge precharged at the composite node CB is discharged to the ground voltage VSS through the N-type MOS transistor N2, resulting in a high-level output signal being output from output terminal C. It should be noted that, at this time, the N-type MOS transistor N1 remains in the off state.

During the precharge period Tpr following the processing period Tlc_3, the trigger signal TRG becomes low level again, and the composite node CB is precharged. Also, at this time, the first and second signals at the time of initialization are supplied to input terminals A and B. At the start time TC_4 and during the processing period Tlc_4, the first and second signals with a logical value of 1 are supplied to input terminals A and B. As a result, the voltage at input terminals A and B becomes high level. Since the voltage at the gate terminals G, the first terminal T1, and the second terminal T2 of the N-type MOS transistors N1 and N2 becomes high level, the N-type MOS transistors N1 and N2 remain in the off state. Consequently, the charge precharged at the composite node CB is not discharged to the ground voltage VSS through the N-type MOS transistors N1 and N2, and the voltage at the composite node CB maintains a high level, resulting in a low-level output signal being output from output terminal C.

Thus, during the processing period Tlc, the exclusive OR operation based on the first and second signals supplied to input terminals A and B is performed in the unit logic circuit LG_A and output. This processing period Tlc can also be considered as a logic operation period.

Figure 7:
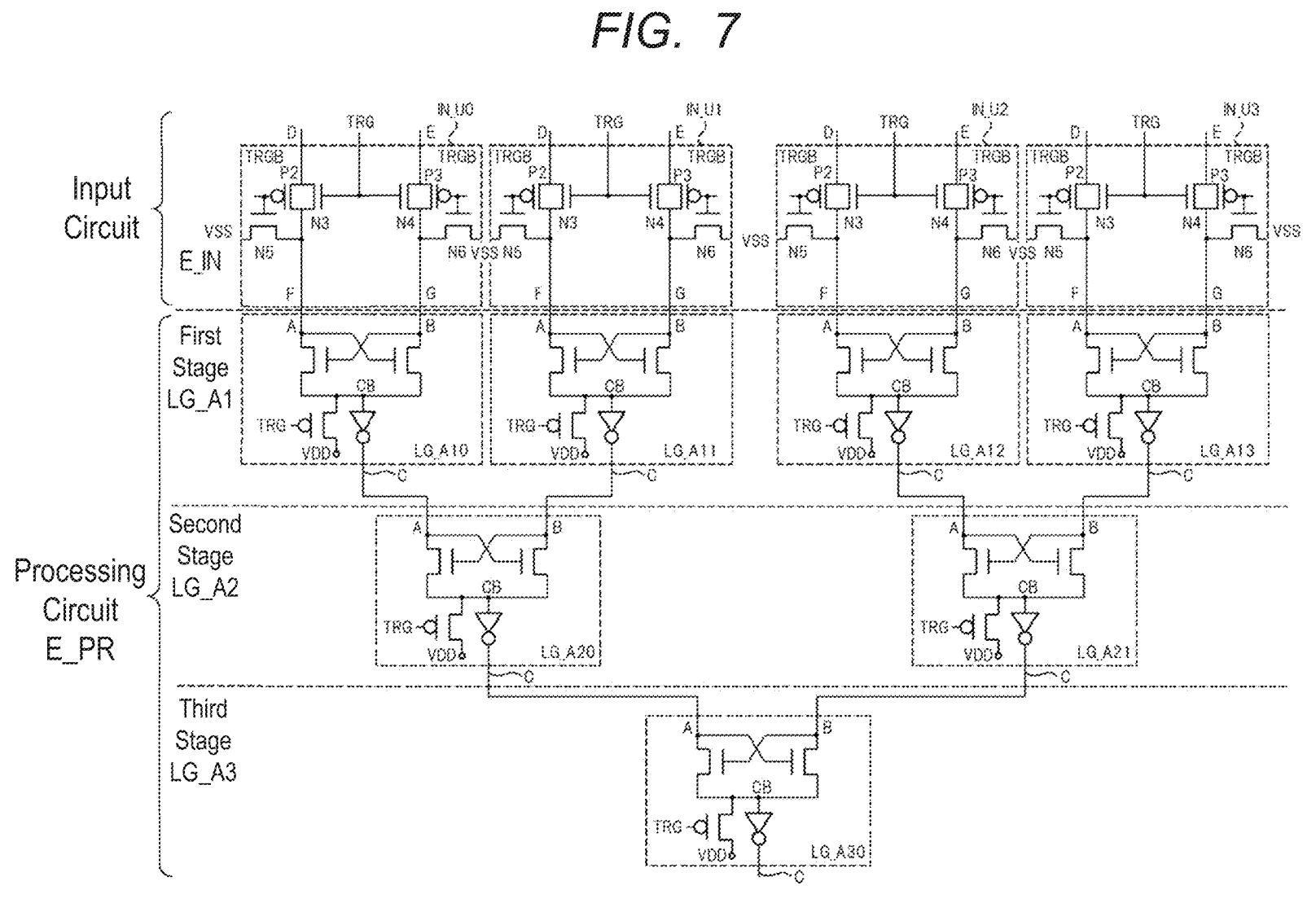

An example of an input circuit E_IN and a processing circuit E_PR according to the first embodiment is shown in the circuit diagram of FIG. 7. The input circuit E_IN shown in FIG. 4 is composed of a plurality of unit input circuits IN_U corresponding to the bits IN [0] to IN [K−1] that constitute the data Din from the previous stage circuit CBP. In FIG. 7, as an example, four-unit input circuits IN_U0 to IN_U3 corresponding to the bits IN [0] to IN [3] are shown. Since the configuration of the four-unit input circuits is the same, the unit input circuit IN_U0 will be described as an example.

The unit input circuit IN_U0 includes N-type MOS transistors N3 to N6, and P-type MOS transistors P2 and P3. The first terminal of the N-type MOS transistor N3 is connected to the first terminal of the P-type MOS transistor P2, the second terminal of the N-type MOS transistor N3 is connected to the second terminal of the P-type MOS transistor P2, a trigger signal TRG is supplied to the gate terminal of the N-type MOS transistor N3, and an inverted trigger signal TRGB is supplied to the gate terminal of the P-type MOS transistor P2. Furthermore, the first terminals of the MOS transistors N3 and P2 are connected to the input terminal D of the unit input circuit IN_UG, and the second terminals of the MOS transistors N3 and P2 are connected to the output terminal F of the unit input circuit IN_U0. Thus, a CMOS pass (transfer) gate, which is composed of the MOS transistors N3 and P2, connected between the input terminal D and the output terminal F, and controlled by the trigger signal TRG (inverted trigger signal TRGB), is formed.

Similarly, a CMOS pass gate, which is composed of the MOS transistors N4 and P3, connected between the input terminal E and the output terminal G, and controlled by the trigger signal TRG (inverted trigger signal TRGB), is formed.

The first terminals of the N-type MOS transistors N5 and N6 are connected to the ground voltage VSS (GND), and the second terminals are connected to the output terminals F and G of the unit input circuit IN_UG, with the inverted trigger signal TRGB supplied to their gate terminals.

During the precharge period when the trigger signal TRG is at a low level (the inverted trigger signal TRGB is at a high level), the N-type MOS transistors N5 and N6 are in the on state, and the N-type MOS transistors N3 and N4 are in the off state. At this time, the P-type MOS transistors P2 and P3 are also in the off state. That is, during the precharge period, the CMOS pass gate is in a non-conductive state, and the input terminals D, E and the output terminals F, G are electrically isolated from each other. At this time, the output terminals F, G are precharged to the ground voltage VSS. That is, the voltage at the output terminals F, G becomes a low level corresponding to the logical value 0.

During the processing (logical operation) period when the trigger signal TRG is at a high level (the inverted trigger signal TRGB is at a low level), the N-type MOS transistors N5 and N6 are in the off state, and the N-type MOS transistors N3 and N4 and the P-type MOS transistors P2 and P3 are in the on state. That is, the output terminals F, G are electrically isolated from the ground voltage VSS and are electrically connected to the input terminals D, E through the CMOS pass gate.

That is, the unit input circuit IN_UG, during the precharge period, outputs a logic value of 0, which is the initial value, regardless of the logic value of the bit supplied, and during the processing period, it outputs the logic value of the supplied bit.

In the processing circuit E_PR according to the first embodiment, a single multi-input logic circuit is formed by connecting multiple two-input unit logic circuits LG_A in a tree-like manner. Specifically, by connecting seven-unit logic circuits LG_A in a tree-like manner across three stages, an eight-input exclusive OR circuit is constructed.

The input terminals A, B of the unit logic circuits LG_A10 to LG_A13, which are placed in the first stage of the tree, are electrically connected to the output terminals F, G of the corresponding unit input circuits IN_U0 to IN_U3, as shown in FIG. 7. Moreover, the input terminals A, B of the unit logic circuits LG_A20, LG_A21, which are placed in the second stage, are connected to the output terminal C of the unit logic circuits LG_A10 to LG_A13, which are placed in the first stage, as shown in FIG. 7. Furthermore, the input terminals A, B of the unit logic circuit LG_A30, which is placed in the third stage, are connected to the output terminal C of the unit logic circuits LG_A20, LG_A21, which are placed in the second stage, as shown in FIG. 7.

For example, describing the unit logic circuit LG_A20 (the first logic circuit), the input terminals A, B of the second-stage unit logic circuit LG_A20 are electrically connected to the output terminal C of the first-stage unit logic circuits LG_A10, LG_A11 (the second logic circuit, the third logic circuit), and the output terminal C of the second-stage unit logic circuit LG_A20 is electrically connected to the input terminal A of the third-stage unit logic circuit LG_A30.

During the precharge period, the output terminals F, G of the unit input circuit IN_U0 are precharged to the ground voltage VSS, thereby supplying the initial logic value of 0 to the first-stage unit logic circuit group LG_A1. Moreover, in the unit logic circuit group LG_A1, during the precharge period, the composite node CB is precharged with a voltage based on the power supply voltage VDD, not the ground voltage VSS. As a result, during the precharge period, the initial logic value of 0 is supplied to the second and subsequent stages of the unit logic circuit groups LG_A2, LG_A3.

During the processing period, the exclusive OR of the data Din (bits IN [0] to IN [7]) is sequentially determined in the first, second, and third stages, and the result of the exclusive OR operation is output from the output terminal C of the third-stage unit logic circuit LG_A30.

In FIG. 7, although an example of a single 8-input logic circuit constructed using seven-unit logic circuits is described, it is not limited to 8 inputs. Furthermore, in the processing circuit E_PR, as described in FIG. 2, multiple multi-input logic circuits as shown in FIG. 7 are provided and electrically connected to each other to realize an encoder.

<<<Example of Output Circuit E_OT>>>

The data generated in the processing circuit E_PR, for example, the calculation result from the 8-input logic circuit shown in FIG. 7, is output from the processing circuit E_PR to the output circuit E_OT as bits XQ [0] to XQ [N−1] forming a code.

Figure 8:
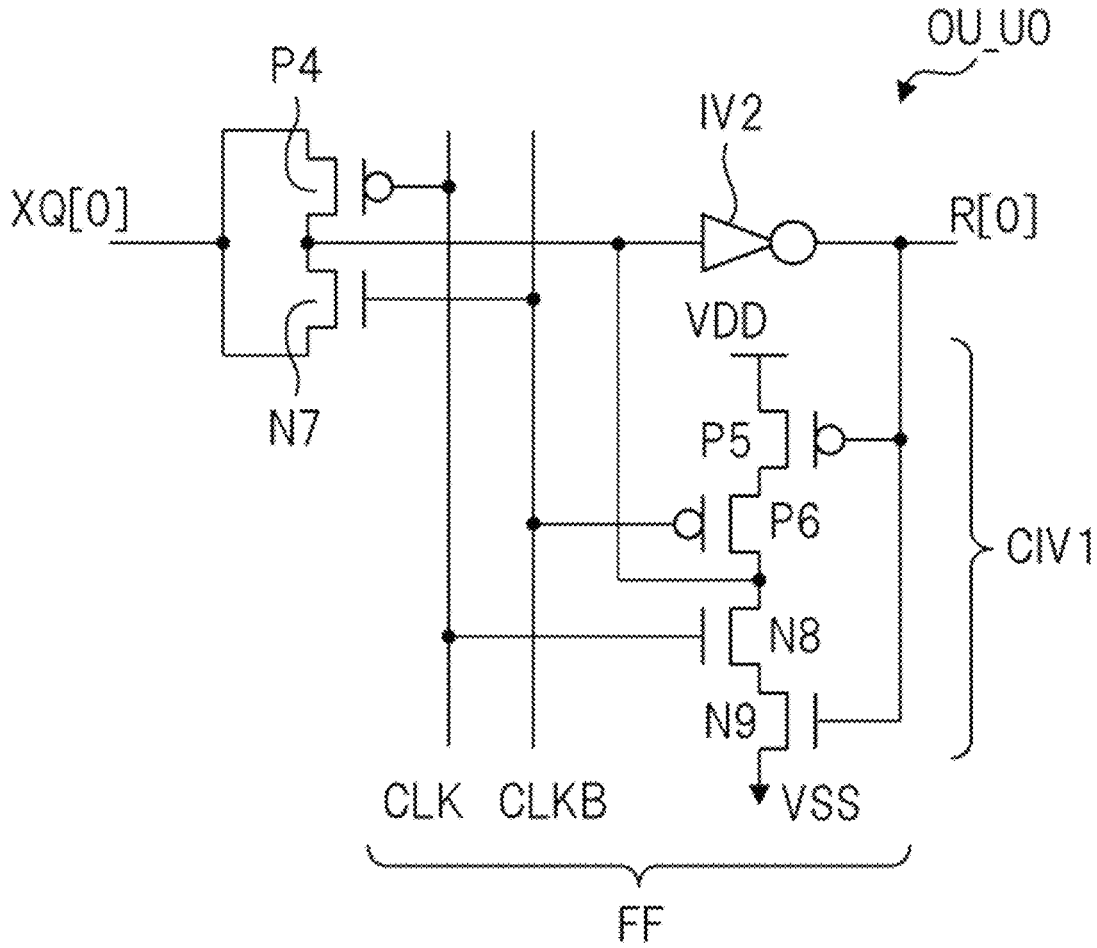
FIG. 8 is a circuit diagram showing an example of the configuration of a unit output circuit according to the first embodiment.

The output circuit E_OT, as shown in FIG. 4, is equipped with multiple unit output circuits OU_U corresponding to bits XQ [0] to XQ [N−1]. Since the unit output circuits OU_U corresponding to bits XQ [0] to XQ [N−1] have the same configuration, here, the unit output circuit OU_U0 corresponding to bit XQ [0] is described as an example. FIG. 8 is a circuit diagram showing an example of the configuration of a unit output circuit according to the first embodiment.

The unit output circuit OU_U0 includes N-type MOS transistors N7 to N9, P-type MOS transistors P4 to P6, and an inverter circuit IV2.

The first terminals of the N-type MOS transistor N7 and the P-type MOS transistor P4 are connected to each other, and their second terminals are also connected to each other. A clock signal CLK is supplied to the gate terminal of the P-type MOS transistor P4, and an inverted clock signal CLKB is supplied to the gate terminal of the N-type MOS transistor N7. Thus, a CMOS pass gate is formed by the P-type MOS transistor P4 and the N-type MOS transistor N7. The input terminal of the CMOS pass gate is supplied with the corresponding bit XQ [0], and its output terminal is connected to the input terminal of the inverter circuit IV2 and the output terminal of the clocked inverter circuit CIV1 described next.

The clocked inverter circuit CIV1, as shown in FIG. 8, is composed of P-type MOS transistors P5, P6 and N-type MOS transistors N8, N9 connected in series between the power supply voltage VDD and the ground voltage VSS. The gate terminal of the P-type MOS transistor P5 and the gate terminal of the N-type MOS transistor N9 are connected to the output terminal of the inverter circuit IV2, the gate terminal of the P-type MOS transistor P6 is supplied with the inverted clock signal CLKB, and the gate terminal of the N-type MOS transistor N8 is supplied with the clock signal CLK. The connection node between the P-type MOS transistor P6 and the N-type MOS transistor N8 becomes the output terminal of the clocked inverter circuit CIV1, and the gate terminals of the P-type MOS transistor P5 and the N-type MOS transistor N9 become the input terminal of the clocked inverter circuit CIV1. The output terminal of the inverter circuit IV2 becomes the output terminal of the unit output circuit OU_U0, and the code R [0] corresponding to bit XQ [0] is output from the unit output circuit OU_U0 to the memory area RBA (shown in FIG. 4) of the memory RM.

In the unit output circuit OU_U0, the CMOS pass gate becomes conductive when the clock signal CLK is at a low level (the inverted clock signal CLKB is at a high level), supplying bit XQ [0] to the inverter circuit IV2, and becomes non-conductive when the clock signal CLK is at a high level, stopping the supply of bit XQ [0] to the inverter circuit IV2. That is, during the period when the clock signal CLK is at a low level, the unit output circuit OU_U0 captures the bit XQ [0].

The input terminal of the inverter circuit IV2 is connected to the output terminal of the clocked inverter circuit CIV1, and the output terminal of the inverter circuit IV2 is connected to the input terminal of the clocked inverter circuit CIV1, thereby constituting a latch circuit FF that operates in synchronization with the clock signal CLK (inverted clock signal CLKB) through the inverter circuit IV2 and the clocked inverter circuit CIV1. The latch circuit FF latches the logic value of bit XQ [0] supplied via the CMOS pass gate when the clock signal CLK is at a high level (the inverted clock signal CLKB is at a low level).

Therefore, the unit output circuit OU_U0 captures the logic value of bit XQ [0] during the period when the clock signal CLK is at a low level, and then, when the clock signal CLK becomes high, it retains the captured logic value of bit XQ [0]. The unit output circuit OU_U0 inverts (logically inverts) the captured logic value of bit XQ [0] and outputs it as code R [0].

<<Operation of the Encoder>>

Figure 9:
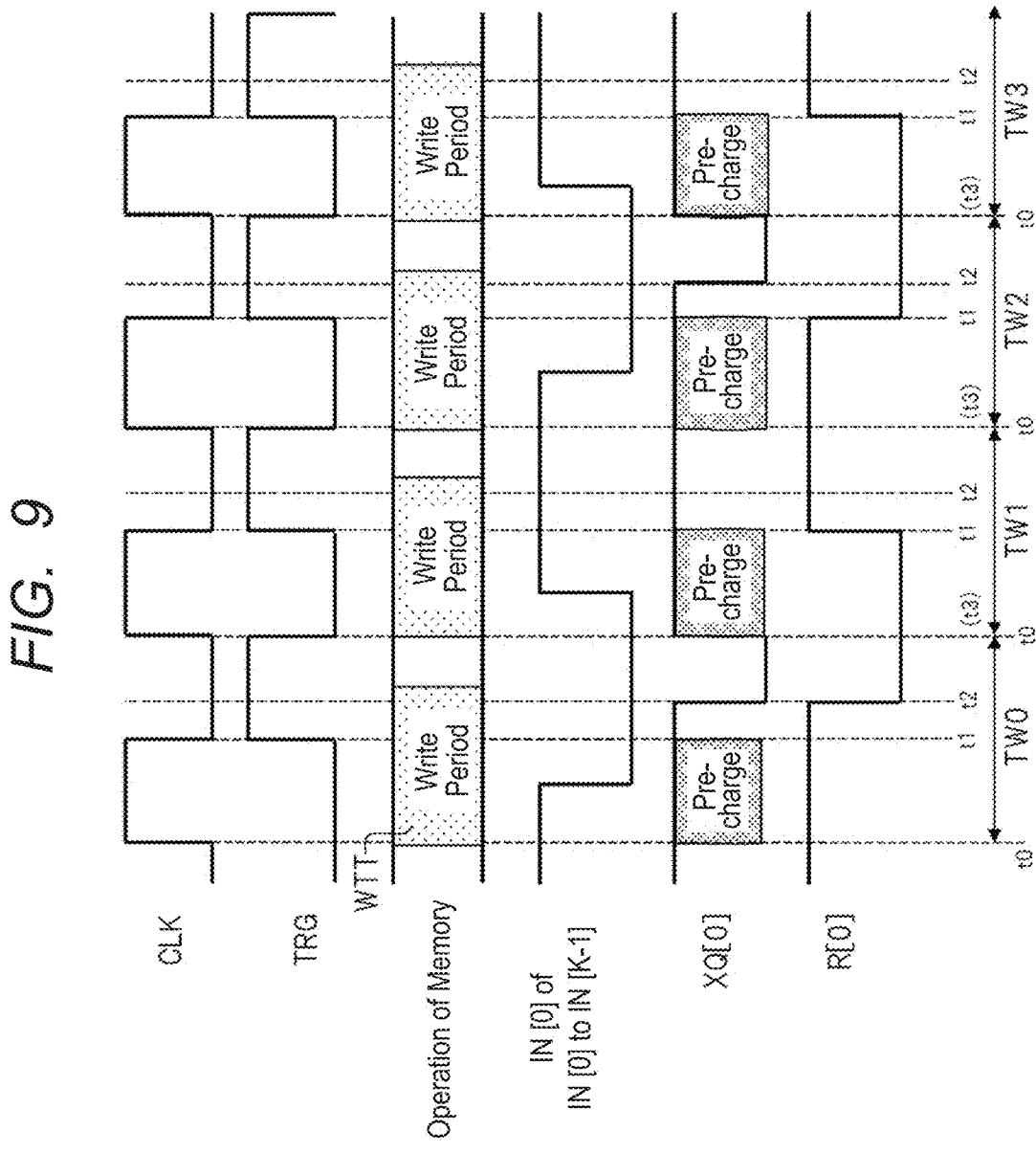
FIG. 9 is a timing chart diagram for explaining the operation of an encoder according to the first embodiment.

Next, the operation of the encoder EC_E shown in FIG. 4 is explained using the drawings. FIG. 9 is a timing chart diagram for explaining the operation of the encoder according to the first embodiment.

The control circuit E_CTE shown in FIG. 4 generates the clock signal CLK and the trigger signal TRG based on the external clock signal ECLK. Although not shown in FIG. 9, the control circuit E_CTE also generates the inverted clock signal CLKB and the inverted trigger signal TRGB. In the first embodiment, the control circuit E_CTE generates a trigger signal that rises in synchronization with the falling edge of the clock signal CLK as the trigger signal TRG.

In the first embodiment, the memory RM (shown in FIG. 1) starts its write and read operations in synchronization with the rising edge of the external clock signal ECLK (in FIG. 9, the clock signal CLK in phase with ECLK). In FIG. 9, WTT indicates the period (write period) during which writing to the storage area RBA of the memory RM is performed. The symbols TW0 to TW3 indicate the write cycles. In the first embodiment, for a given write cycle in which code R is written into the memory RM, the code R to be written in the given write cycle is generated in the write cycle immediately preceding the given write cycle.

Bits IN [0] to IN [K−1] constituting data Din are input to the input circuit E_IN during the time t0 to t1 of the first write cycle TW0. In FIG. 9, only bit IN [0] of bits IN [0] to IN [K−1] is shown as an example. In the input circuit E_IN and the processing circuit E_PR, precharge is performed during the period when the trigger signal TRG is at a low level (the inverted trigger signal TRGB is at a high level), as described in FIGS. 5 to 7. Therefore, during the period of time t0 to t1 of the first write cycle TW0, the input circuit E_IN and the processing circuit E_PR are precharged. Because precharging is performed, the data supplied from the processing circuit E_PR to the output circuit E_OT (data constituted by bits XQ [0] to XQ [N−1]) becomes precharge level. In FIG. 9, only bit XQ [0] is shown as a representative, and the precharge level is at a high level (for example, the power supply voltage VDD).

Furthermore, as described in FIG. 8, the output circuit E_OT, during the period when the clock signal CLK is at a high level, the CMOS pass gate composed of the N-type MOS transistor N7 and the P-type MOS transistor P4 becomes non-conductive. Therefore, during the period of time t0 to t1 of the write cycle TW0, the data supplied to the output circuit E_OT is not output as code R.

At the time t1 of the write cycle TW0, when the trigger signal TRG changes to a high level (the inverted trigger signal TRGB is at a low level), as shown in FIGS. 5 to 7, precharging in the input circuit E_IN and the processing circuit E_PR is completed, and logical operations on data Din are sequentially performed by the unit logic circuits arranged in a tree structure in the processing circuit E_PR, and during the period of time t1 to t2 of cycle TW0, code R (a bit string including bit R [0]) is generated.

During the time t1 to t3 of cycle TW0, because the clock signal CLK is at a low level (the inverted clock signal CLKB is at a high level), during this period, as described in FIG. 8, the CMOS pass gate composed of the N-type MOS transistor N7 and the P-type MOS transistor P4 becomes conductive, and the code R generated during the period of time t1 to t2 of the write cycle TW0 is held in the latch circuit FF of the output circuit E_OT, and code R is to be supplied to the memory RM.

During the time t2 to t3 of the write cycle TW0, the code R supplied to the memory RM is written into the storage area RBA of the memory RM during the write period WTT starting from time t0 (the same as time t3 of the previous write cycle TW0) of the subsequent write cycle TW1.

During the write cycle TW1 at times t0 to t3, the same operations are performed as during the write cycle TW0 at times t0 to t3. This is also the case for subsequent write cycles such as TW3.

In the case where the number of bits in data Din, comprising bits IN [0] to IN [K−1], that have a logical value of 1 is even, the processing circuit E_PR generates a bit R [0] of code R with a logical value of 0, as shown during the time t2 to t3 of the write cycle TW0. Conversely, if the number of bits in data Din, comprising bits IN [0] to IN [K−1], that have a logical value of 1 is odd, the processing circuit E_PR generates a bit R [0] of code R with a logical value of 1, as shown during the time t2 to t3 of the write cycle TW1. Although bit R [0] is mentioned as an example, the same applies to other bits.

The processing circuit E_PR, which includes a unit logic circuit LG_A and multiple unit logic circuits LG_A according to the first embodiment, is a dynamic circuit that requires a precharge operation. That is, it is necessary to secure a period (time) for performing the precharge operation. It is feared that this period for the precharge operation may slow down the operation of the semiconductor device. However, according to the first embodiment, as shown in FIG. 9, the period for the precharge operation partially overlaps with the write period WTT to the memory RM. Thus, by having the period for the precharge operation obscured by the write period WTT, it is possible to suppress the slowing down of the operation of the semiconductor device.

<<Decoder EC_D and Correction Circuit EC_C Relevant Part>>

Figure 10:
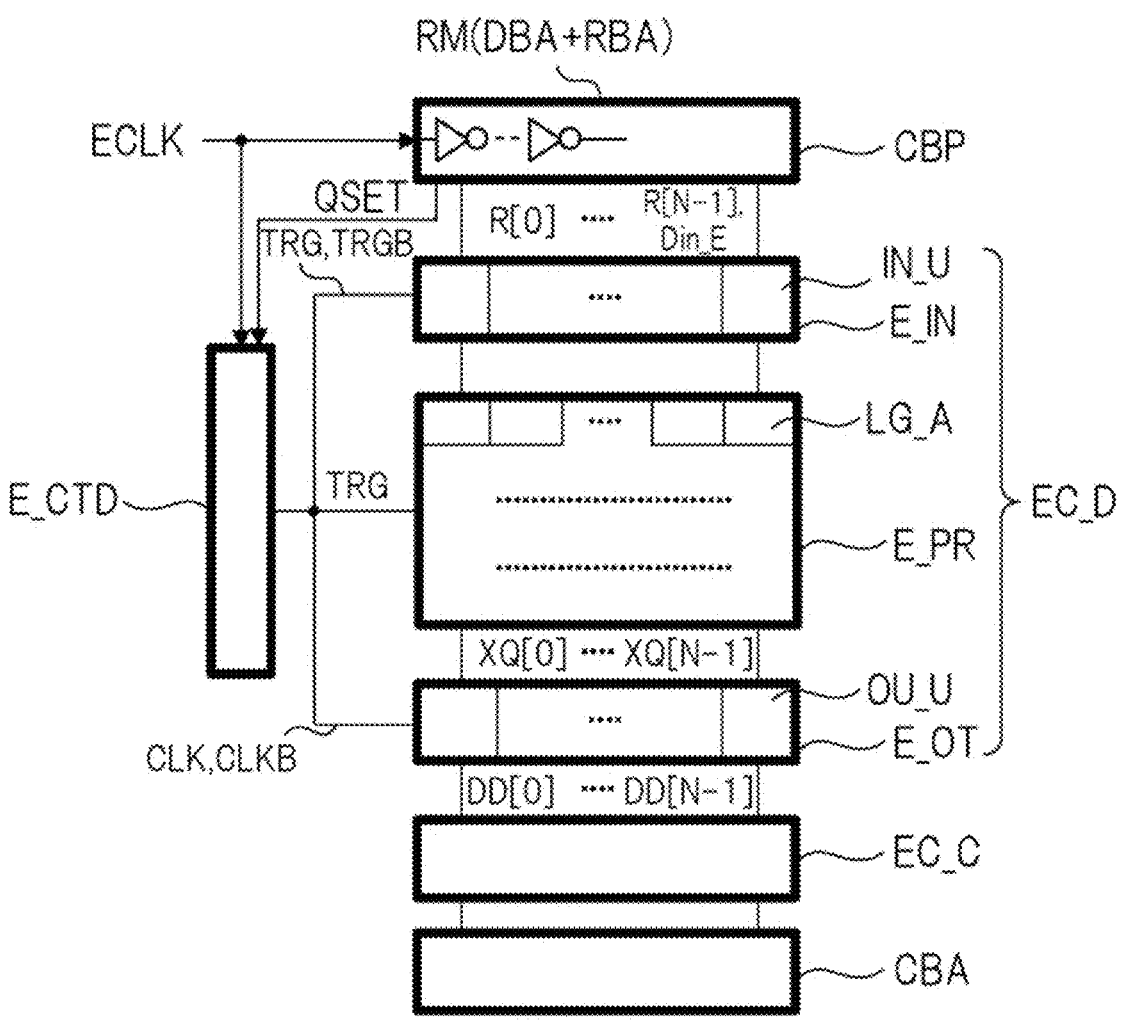
FIG. 10 is a block diagram showing an example of an ECC circuit according to the first embodiment.

FIG. 10 is a block diagram showing an example of an ECC circuit according to the first embodiment. The figure mainly shows the parts corresponding to the decoder EC_D and the correction circuit EC_C described in FIG. 1. In FIG. 10, RM (storage area DBA+RBA) corresponds to the memory shown in FIG. 1, and CBA corresponds to the subsequent circuit CBA shown in FIG. 1. The decoder EC_D includes an input circuit (second input circuit) E_IN, a processing circuit (second processing circuit) E_PR, an output circuit (second output circuit) E_OT, and a control circuit (second control circuit) E_CTD.

The memory RM starts its read operation in synchronization with the rising edge of the external clock signal ECLK. The code R and data Din_E read from the storage areas RBA; DBA of the memory RM is input to the input circuit E_IN. The data and code output from the input circuit E_IN are input to the processing circuit E_PR. The data (bits XQ [0] to XQ [N−1]) resulting from the processing in the processing circuit E_PR are input to the output circuit E_OT. The output circuit E_OT outputs the input data as data DD (bits DD [0] to DD [N−1]) to the correction circuit EC_C.

The memory RM according to the first embodiment is not particularly limited but includes multiple inverter circuits as shown in FIG. 10, and using these inverter circuits, etc., generates an output completion signal QSET indicating the timing at which the read operation is completed based on the external clock signal ECLK.

The control circuit E_CTD is supplied with the external clock signal ECLK and the output completion signal QSET from the memory RM and based on the external clock signal ECLK and the output completion signal QSET, the control circuit E_CTD generates a trigger signal TRG, an inverted trigger signal TRGB, a clock signal CLK, and an inverted clock signal CLKB.

The input circuit E_IN is similar to the input circuit E_IN shown in FIG. 4. The main difference is that the input circuit E_IN shown in FIG. 10 is supplied with the code R (R [0] to R [N−1]) and data Din_E from the memory RM. The output circuit E_OT is also similar to the output circuit E_OT shown in FIG. 4. The main difference is that the output circuit E_OT shown in FIG. 10 outputs the data (bits XQ [0] to XQ [N−1]) as data DD (bits DD [0] to DD [N−1]) to the correction circuit EC_C. Furthermore, the processing circuit E_PR is also similar to the processing circuit E_PR shown in FIG. 4. The main difference is that in the processing circuit E_PR shown in FIG. 10, multiple unit logic circuits LG_A are connected to form logic circuits such as the XOR circuits XR_D0 to XR_D2 described in FIG. 3, and furthermore, AND circuits AD_D0 to AD_D3, AD_EF as described in FIG. 3 are provided in the processing circuit E_PR.

The operation of the input circuit E_IN, the processing circuit E_PR, and the output circuit E_OT shown in FIG. 10 is similar to the operations described using FIGS. 4 to 8, so it is omitted here.

Correction circuit EC_C is supplied with data DD (bits DD [0] to DD [N−1]) and data Din_E from storage area DBA. Correction circuit EC_C includes logic circuits such as XOR circuits XR_C0 to XR_C3 described in FIG. 3, and corrects, for example, bits where errors have occurred, and supplies the corrected data to subsequent circuit CBA.

<<Operation of the Decoder>>

Figure 11:
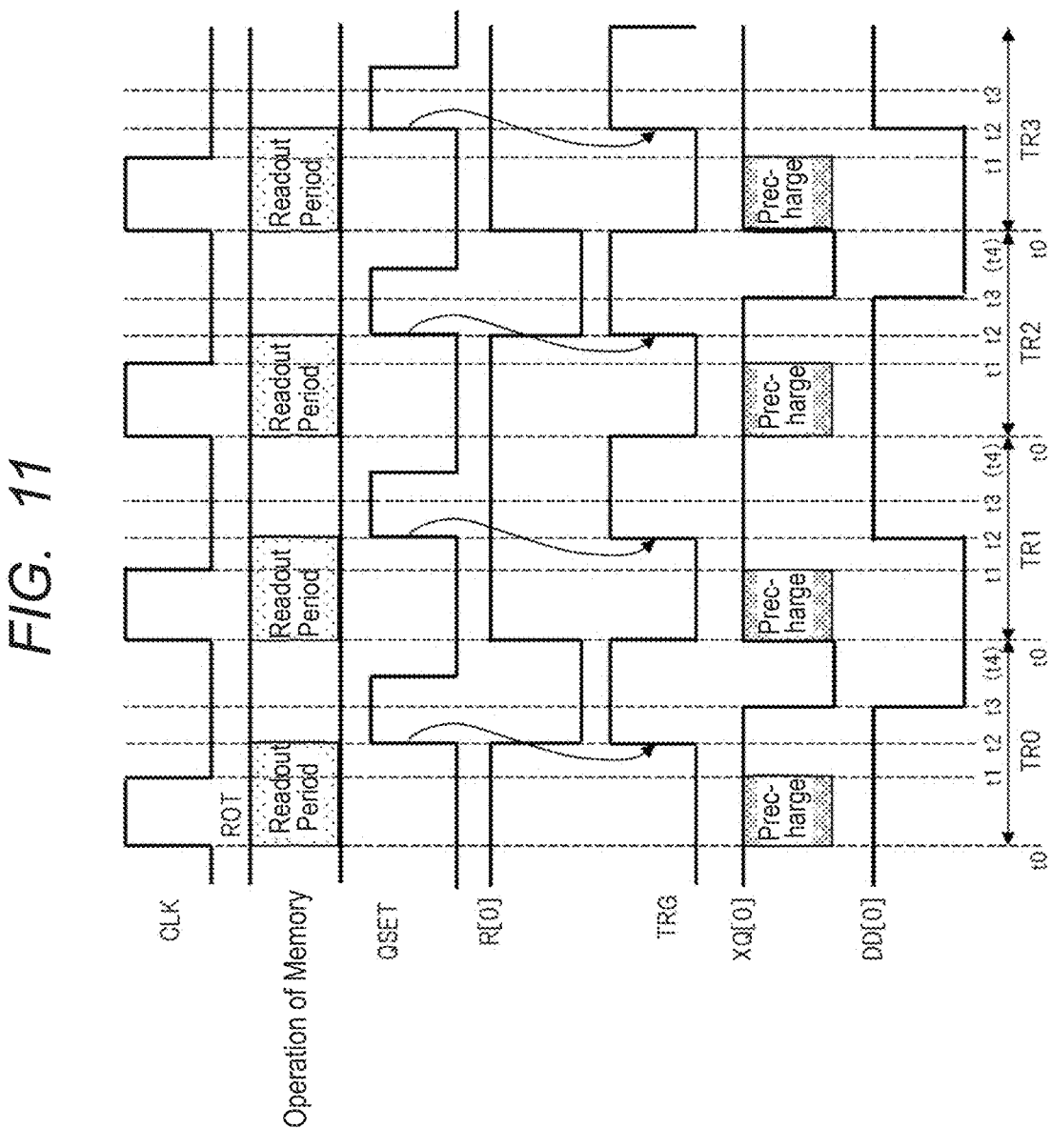
FIG. 11 is a timing chart diagram for explaining the operation of a decoder according to the first embodiment.

Next, the operation of the decoder shown in FIG. 10 will be described using the drawings. FIG. 11 is a timing chart diagram for explaining the operation of the decoder according to the first embodiment.

In FIG. 11, ROT indicates the period (readout period) of the operation of reading data Din_E and code R from memory RM. The start point of the readout period ROT is, as shown in FIG. 11, the rising timing of the clock signal CLK. Furthermore, symbols TR0 to TR3 indicate the readout cycles of data Din and code R.

In the first embodiment, the trigger signal TRG and the inverted trigger signal TRGB are generated by control circuit E_CTD based on the rising timing of the output completion signal QSET. The pulse width (width in the time axis direction) of the trigger signal TRG and the inverted trigger signal TRGB is set by, for example, a delay circuit provided in control circuit E_CTD.

At times t0 to t2 of the readout cycle TR0, the trigger signal TRG becomes low level. As a result, as explained in FIG. 9, precharging is performed in the input circuit E_IN and the processing circuit E_PR. Because precharging is performed, the bits XQ [0] to XQ [N−1] output from processing circuit E_PR become high level. In FIG. 11, only bit XQ [0] is shown. Furthermore, precharging is shown in FIG. 11 as being performed during the period from time t0 to t1.

When the readout is completed at time t2 of the readout cycle TR0, and the output completion signal QSET rises, in response, the trigger signal TRG rises. As a result, the input circuit E_IN captures the bits R [0] to R [N−1] of data Din_E and code R read from memory RM and supplies them to the processing circuit E_PR. In the processing circuit E_PR, logical operations are performed. The result bits XQ [0] to XQ [N−1] are generated between times t2 and t3 of the readout cycle TR0 and supplied to the output circuit E_OT.

Output circuit E_OT captures the result of the operation during the period when the clock signal CLK is at low level, as shown in FIG. 8, and when the clock signal CLK changes to high level, the captured result is held in latch circuit FF. Therefore, during times t0 to t1 of the next readout cycle TR1, the bits DD [0] to DD [N−1] corresponding to the result bits XQ [0] to XQ [N−1] in processing circuit E_PR are supplied from output circuit E_OT to correction circuit EC_C.

In the decoder according to the first embodiment, the period of the precharge operation partially overlaps with the readout period ROT during which reading is performed from memory RM. That is, it is possible to suppress the slowing down of the operation of the semiconductor device by hiding the period of the precharge operation during the readout period ROT.

Similarly to the processing circuit E_PR for the encode EC_E shown in FIG. 4, in the decoder EC_D and in the processing circuit E_PR, if the number of bits whose logic value is 1 among the data input from the input circuit E_IN is even, the processing circuit E_PR generates a bit DD [0]

with a logic value of 0 during the time t3 to t4 of the readout cycle TR0, as shown. On the other hand, if the number of bits whose logic value is 1 among the data input from the input circuit E_IN is odd, the processing circuit E_PR generates a bit DD [0] with a logic value of 1 during the time t3 to t4 of the readout cycle TR1, as shown.

The unit logic circuit LG_A related to the first embodiment and the processing circuit E_PR comprising a plurality of unit logic circuits LG_A are dynamic circuits that require a precharge operation. That is, it becomes necessary to secure a period (time) for performing the precharge operation, and there is a concern that the operation of the semiconductor device may slow down. However, according to the first embodiment, as shown in FIG. 11, the period of the precharge operation partially overlaps with the readout period ROT for reading from the memory RM. That is, since the period of the precharge operation can be hidden by the readout period ROT, it is possible to suppress the slowing down of the operation of the semiconductor device.

In FIGS. 9 and 11, it was explained that the bits XQ [0] to XQ [N−1], which are the output from the processing circuit E_PR, become high level due to precharge. On the other hand, in the configuration of the processing circuit shown in FIG. 7, the output terminal C of the third-stage unit logic circuit LG_A30 becomes low level due to precharge. This is because a logic circuit (not shown) that causes a logic inversion is provided between the third-stage unit logic circuit LG_A30 shown in FIG. 7 and the output of the processing circuit E_PR. To eliminate the logic inversion caused by the logic circuit not shown, the unit output circuit OU_U0 is configured to output by inverting the logic, as explained in FIG. 8. Of course, the bits XQ [0] to XQ [N−1] from the processing circuit E_PR may also be made to become low level due to precharge.

First Modified Example

In the first modified example, the preceding circuit CBP and the control circuit E_CTE shown in FIG. 4 are changed. That is, the preceding circuit CBP is changed to generate a timing signal CCONT and supply it to the control circuit E_CTE. The preceding circuit CBP generates a timing signal CCONT indicating completion when the processing in the preceding circuit CBP is completed, similar to the output completion signal QSET explained in FIGS. 10 and 11. The control circuit E_CTE related to the first modified example generates a trigger signal TRG, an inverted trigger signal TRGB, a clock signal CLK, and an inverted clock signal CLKB, which are timing signals according to the processing of the preceding circuit CBP, based on the timing signal CCONT. The remaining circuit blocks shown in FIG. 4 are not changed.

In the first modified example, once the processing in the preceding circuit CBP is completed, based on the completion of this processing, the input circuit E_IN, the processing circuit E_PR, and the output circuit E_OT will start their operations. This allows for the elimination of delay loss in the sequential relationship and enables acceleration.

Second Modified Example

While FIGS. 1 to 11 describe an exclusive OR circuit as the unit logic circuit LG_A, the second modified example explains a negated exclusive OR circuit (hereinafter, also referred to as an XNOR circuit).

Figure 12A:
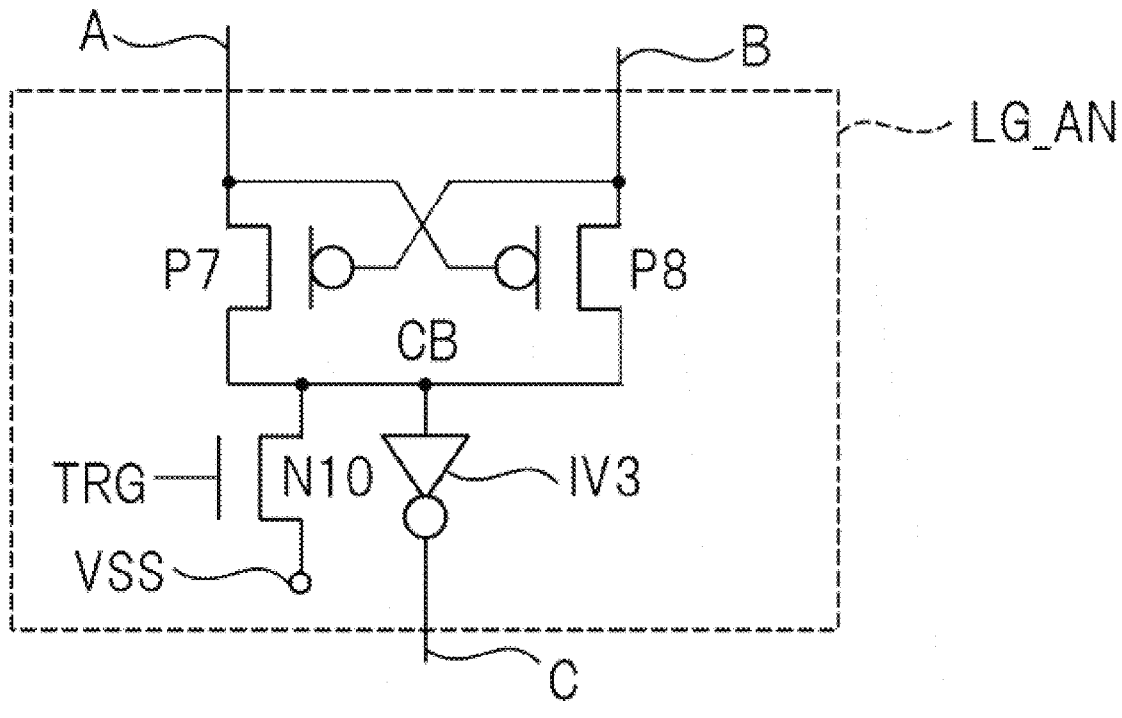

FIG. 12 is a diagram for explaining a unit logic circuit according to the second modified example of the first embodiment. Here, FIG. 12A shows a circuit diagram of an XNOR circuit constituting the unit logic circuit LG_AN, and FIG. 12B is a truth table showing the operation of the XNOR circuit of FIG. 12A.

As shown in FIG. 12A, the XNOR circuit includes P-type MOS transistors P7, P8, N-type MOS transistor N10, and inverter circuit IV3. These MOS transistors and the inverter circuit constitute a 2-input XNOR circuit.

The first terminal of the P-type MOS transistor P7 is connected to the input terminal A of the XNOR circuit and the gate terminal of the P-type MOS transistor P8, and the first terminal of the P-type MOS transistor P8 is connected to the input terminal B of the XNOR circuit and the gate terminal of the P-type MOS transistor P7. Furthermore, the second terminals of the P-type MOS transistors P7, P8 are connected to a composite node CB to which the input terminal of the inverter circuit IV3 is connected, and an N-type MOS transistor N10 is connected between the composite node CB and the ground voltage VSS (GND). That is, the first terminal of the N-type MOS transistor N10 is connected to the ground voltage VSS, the second terminal is connected to the composite node CB, and a trigger signal TRG is supplied to the gate terminal. The output terminal of the inverter circuit IV3 is connected to the output terminal C of the XNOR circuit.

The XNOR circuit related to the second modified example operates in the order of a precharge period and a processing period, similar to the XOR circuit described in FIGS. 5 and 6. That is, during the precharge period, the trigger signal TRG is at a high level (logical value 1), and the N-type MOS transistor N10 is in the on state. As a result, the composite node CB is precharged (discharged) with a voltage based on the ground voltage VSS. Thereafter, the trigger signal TRG becomes low level (logical value 0), and it transitions to the processing period.

For example, during the processing period, as shown in FIG. 12B, when signals of the same logical value (0, 0 or 1, 1) (first signal, second signal) are supplied to the input terminals A, B, a logical value 1 is output from the output terminal C. On the other hand, when signals of different logical values are supplied to the input terminals A, B, a logical value 0 is output from the output terminal C. Thus, a 2-input XNOR circuit can be realized with a smaller number of elements.

In the XOR circuit shown in FIG. 5 and the XNOR circuit shown in FIG. 12, the P-type MOS transistors and N-type MOS transistors may be changed to MOS transistors of the opposite conductivity type. For example, in FIG. 5, MOS transistors N1, N2 may be changed to P-type MOS transistors, and MOS transistor P1 may be changed to an N-type MOS transistor. In this case, the inverter circuit IV1 would be changed to a buffer circuit that does not perform an inversion operation. Such a non-inverting buffer circuit can be realized, for example, by connecting an even number of inverter circuits in series, but this would increase the number of MOS transistors and lead to an increase in the occupied area. To suppress the increase in the occupied area, it is desirable to have the configuration shown in FIG. 5. Although the XOR circuit is described as an example, similarly for the XNOR circuit, to suppress the increase in the occupied area, it is desirable to have the configuration shown in FIG. 12.

Second Embodiment

The first embodiment described a semiconductor device equipped with an ECC circuit composed of multiple unit logic circuits. The circuit composed of multiple unit logic circuits is not limited to ECC circuits. The second embodiment describes an example other than ECC circuits. Specifically, it describes a multi-input parallel multiplier (hereinafter, simply referred to as a multiplier) composed of multiple unit logic circuits.

Figure 13:
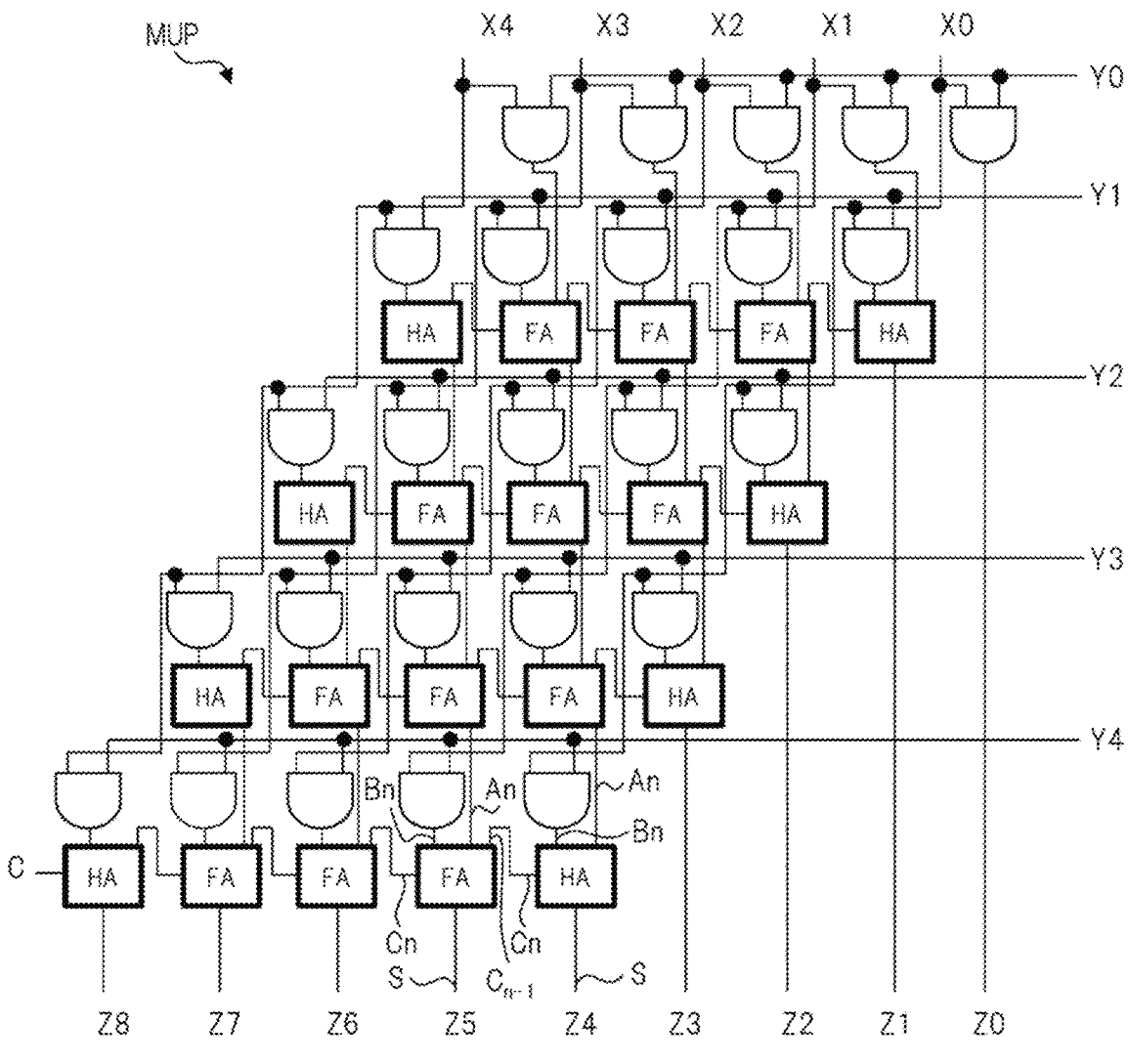
FIG. 13 is a block diagram showing the configuration of a parallel multiplier according to the second embodiment.

FIG. 13 is a block diagram showing the configuration of the multiplier according to the second embodiment. In FIG. 13, MUP indicates a multiplier formed on a semiconductor chip. The multiplier MUP is composed of multiple full adder circuits (full adders) FA, multiple half adder circuits (half adders) HA, and multiple AND circuits, as shown in FIG. 13. The multiplier MUP shown in FIG. 13 multiplies the first input data composed of bits X0 to X4 and the second input data composed of bits Y0 to Y4, and calculates the multiplication result composed of bits Z0 to Z8 and the carry C.

Figure 14A:
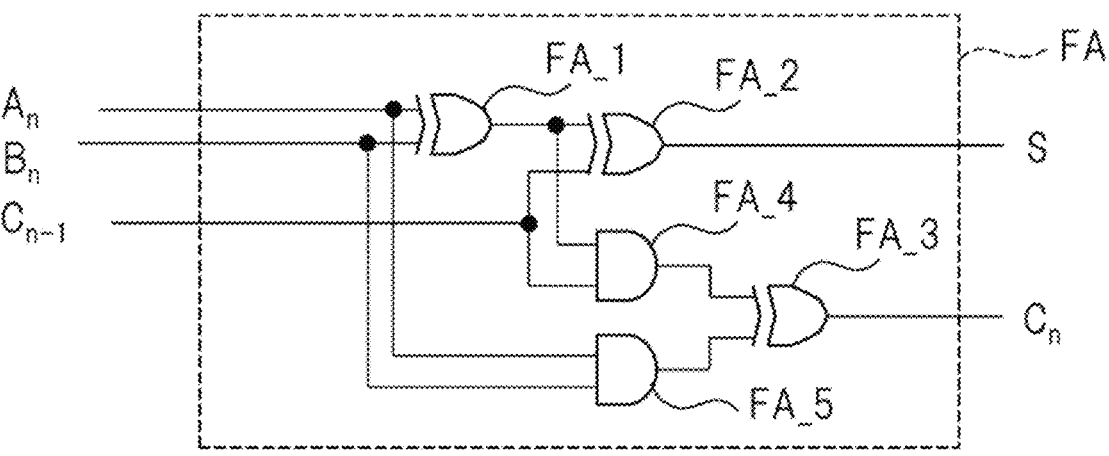
FIGS. 14A and 14B are block diagrams showing the configuration of an addition circuit according to the second embodiment.
Figure 14B:
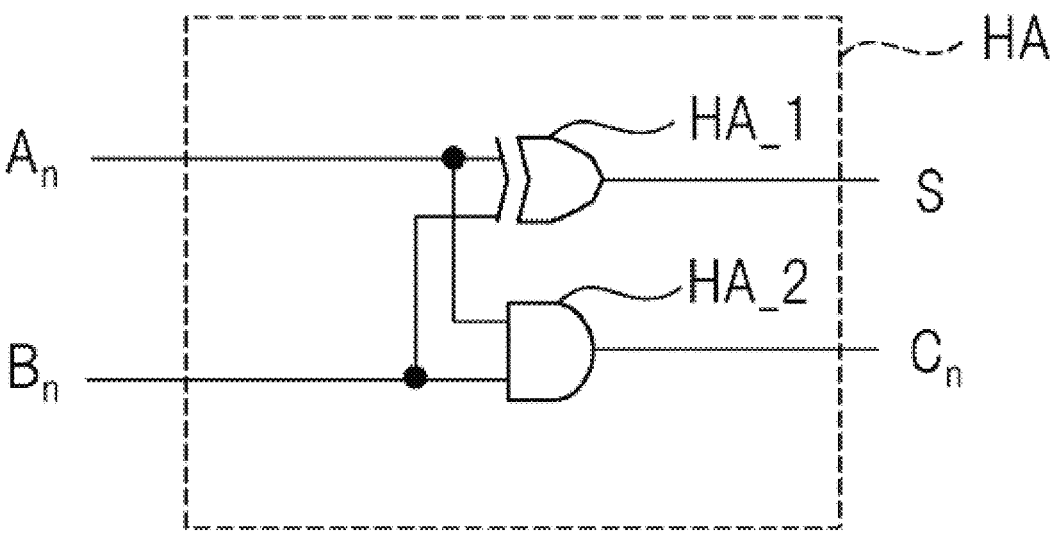

FIG. 14 is a block diagram showing the configuration of the addition circuit according to the second embodiment. Here, FIG. 14A shows the configuration of the full adder circuit FA, and FIG. 14B shows the configuration of the half adder circuit HA. The full adder circuit FA is composed of three XOR circuits FA_1 to FA_3 and two AND circuits FA 4 to FA 5, as shown in FIG. 14A, and the half adder circuit HA is composed of one XOR circuit HA_1 and one AND circuit HA_2, as shown in FIG. 14B.

In the second embodiment, each of the three XOR circuits FA_1 to FA_3 that constitute the full adder circuit FA shown in FIG. 14A is composed of the XOR circuit shown in FIG. 5. Also, the XOR circuit HA_1 that constitutes the half adder circuit HA shown in FIG. 14B is composed of the XOR circuit shown in FIG. 5. This allows for a reduction in the occupied area of the XOR circuits and suppresses an increase in the occupied area of the multiplier MUP. Of course, not all XOR circuits in the full adder circuits FA and half adder circuits HA that constitute the multiplier MUP need to have the configuration shown in FIG. 5.

Third Embodiment

Figure 15:
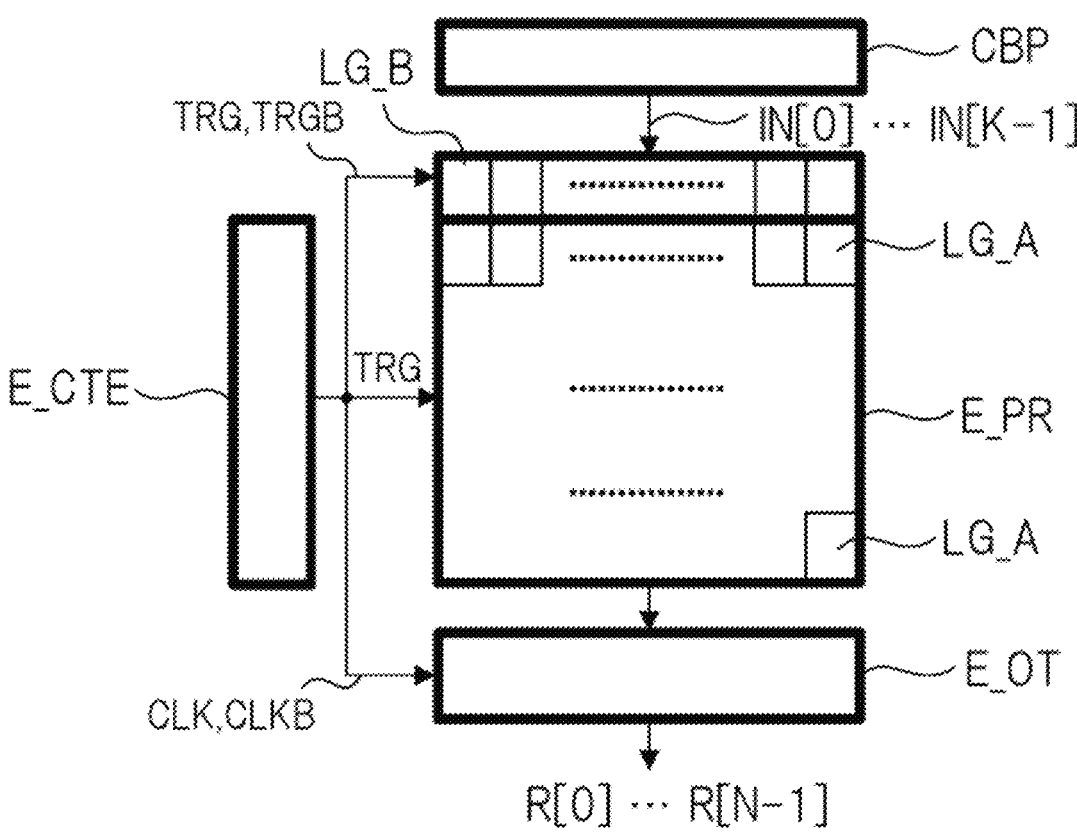
FIG. 15 is a block diagram showing an example of an ECC circuit according to the third embodiment.

FIG. 15 is a block diagram showing an example of an ECC circuit according to the third embodiment. This figure primarily shows the part corresponding to the encoder EC_E described in FIG. 1. FIG. 15 is similar to FIG. 4. The main differences are that in FIG. 15, the input circuit E_IN shown in FIG. 4 is not provided, and the bits IN[0] to IN[K−1], which are data from the previous stage circuit CBP, are input to the processing circuit E_PR, and the processing circuit E_PR includes two types of unit logic circuits (first unit logic circuit, second unit logic circuit) LG_A, LG_B. Each of the two types of unit logic circuits LG_A and LG_B is provided with multiple units in the processing circuit E_PR.

The unit logic circuit (second unit logic circuit) LG_A has the configuration shown in FIG. 5 and operates as described using FIG. 6, among others. On the other hand, the unit logic circuit (first unit logic circuit) LG_B includes the functions of the unit logic circuit LG_A and the unit input circuit IN_U. In other words, the unit logic circuit LG_B is an addition of the function of the unit input circuit IN_U to the unit logic circuit LG_A.

Figure 16:
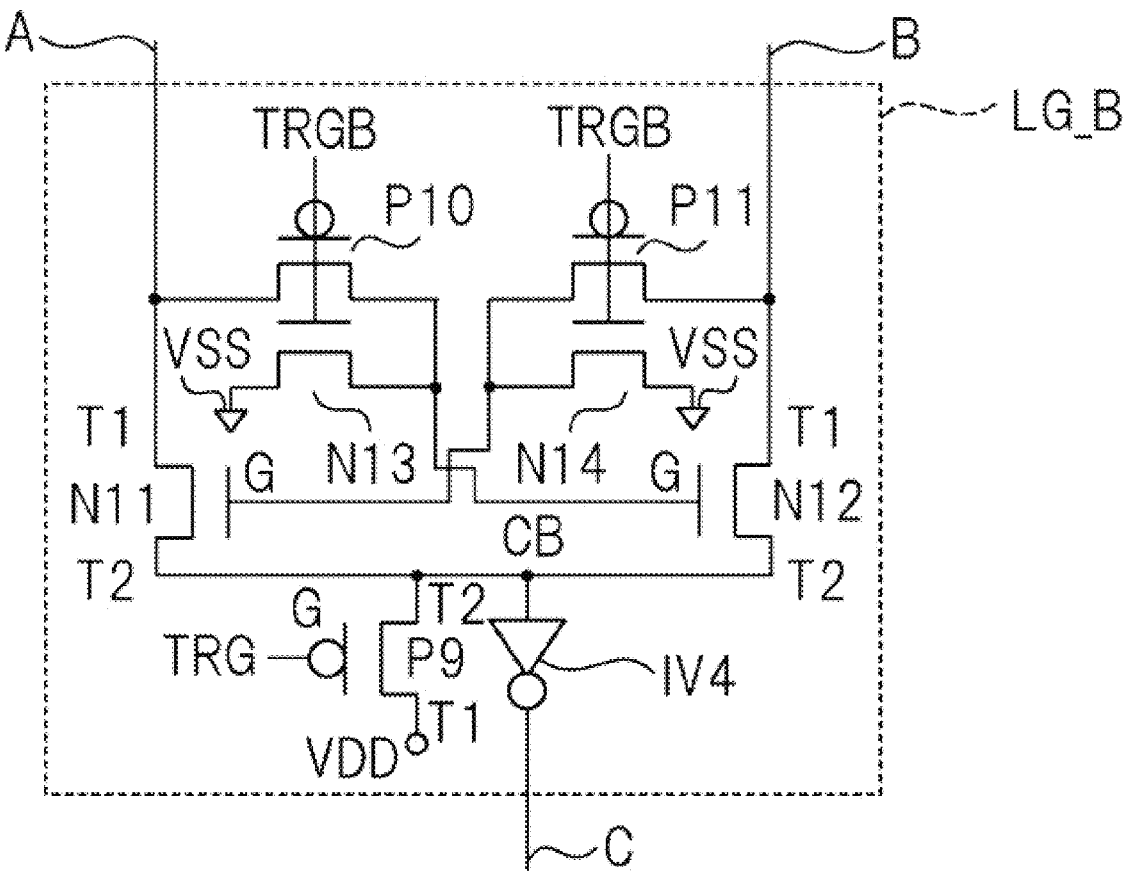
FIG. 16 is a circuit diagram showing the configuration of a unit logic circuit according to the third embodiment.

FIG. 16 is a circuit diagram showing the configuration of a unit logic circuit according to the third embodiment. The unit logic circuit LG_B comprises N-type MOS transistors N11 to N14, P-type MOS transistors P9 to P11, and an inverter circuit IV4.

The N-type MOS transistor (first MOS transistor) N11 has its first terminal T1 connected to the input terminal A of the unit logic circuit LG_B, and its gate terminal G is connected to the input terminal B of the unit logic circuit LG_B via the source-drain (first terminal-second terminal) path of the P-type MOS transistor (seventh MOS transistor) P11. Furthermore, the N-type MOS transistor (second MOS transistor) N12 has its first terminal T1 connected to the input terminal B of the unit logic circuit LG_B, and its gate terminal G is connected to the input terminal A of the unit logic circuit LG_B via the source-drain path of the P-type MOS transistor (eighth MOS transistor) P10. The second terminals T2 of the N-type MOS transistors N11 and N12 are connected to a composite node CB to which the input terminal of the inverter circuit IV4 is connected. The composite node CB is connected to the power supply voltage VDD via the source-drain path of the P-type MOS transistor (third MOS transistor) P9. Furthermore, the output terminal of the inverter circuit IV4 is connected to the output terminal C of the unit logic circuit LG_B.

The gate terminals G of the N-type MOS transistors N11 and N12 are connected to the ground voltage VSS via the source-drain paths of the N-type MOS transistors N14 and N13.

A trigger signal TRG is supplied to the gate terminal G of the P-type MOS transistor P9. In contrast, an inverted trigger signal TRGB is supplied to the gates of the N-type MOS transistors N13, N14 and the P-type MOS transistors P10, P11.

The N-type MOS transistors N11, N12, and the P-type MOS transistor P9 shown in FIG. 16 correspond to the N-type MOS transistors N1, N2, and the P-type MOS transistor P1 shown in FIG. 4.

During the precharge period, the P-type MOS transistor P9 is turned on, and the composite node CB is precharged with a voltage based on the power supply voltage VDD. Also, during the precharge period, the N-type MOS transistors N13, N14 are turned on and the P-type MOS transistors P10, P11 are turned off by the inverted trigger signal TRGB. As a result, the N-type MOS transistors N11 and N12 are turned off, and the gate terminals G of the N-type MOS transistors N11 and N12 are electrically isolated from the input terminals B, A. Consequently, during the precharge period, a low-level logic value is output as an initial value from the output terminal C.

At the end of the precharge period and during the processing period, the trigger signal TRG goes high, and the inverted trigger signal TRGB goes low. As a result, N-type MOS transistors N13, N14 are turned off, and P-type MOS transistors P10, P11 are turned on. Consequently, the input terminal A is electrically connected to the gate terminal G of the N-type MOS transistor N12 via the P-type MOS transistor P10. Similarly, the input terminal B is electrically connected to the gate terminal G of the N-type MOS transistor N11 via the P-type MOS transistor P11. Thus, during the processing period, the N-type MOS transistors N11, N12 operate similarly to the N-type MOS transistors N1, N2 in FIG. 4, performing the exclusive logical sum of the signals supplied to the input terminals A, B, and outputting the result from the output terminal C.

For example, the unit logic circuit LG_B is used as the first stage of the unit logic circuit group (LG_A10 to LG_A13) in FIG. 7. When the unit logic circuit LG_B shown in FIG. 16 is used as the unit logic circuit LG_A10 shown in FIG. 7, the unit input circuit IN_U0 is omitted, and the bits IN[0], IN[1] are supplied to the input terminals A, B of the unit logic circuit LG_B shown in FIG. 16, and the output terminal C of the unit logic circuit LG_B is connected to the input terminal A of the second stage unit logic circuit LG_A20. Of course, in this case, the second stage unit logic circuit LG_A20 is composed of the unit logic circuit LG_A.

Herein, an example is shown where the processing circuit in the encoder EC_E is composed of two types of unit logic circuits LG_A and LG_B, but this is not limited thereto. That is, the processing circuit in the decoder EC_D may also be composed of two types of unit logic circuits LG_A and LG_B. Of course, the processing circuits of both the encoder EC_E and the decoder EC_D may be composed of two types of unit logic circuits LG_A and LG_B.

According to the third embodiment, it is possible to omit the input circuit E_IN, thereby further reducing the number of elements and further suppressing the increase in occupied area.

Figure 17:
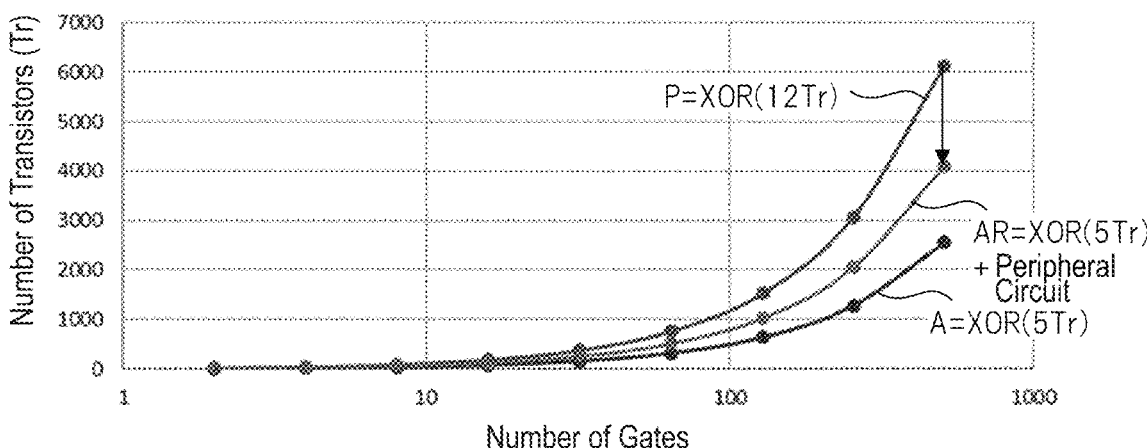
FIG. 17 is a diagram for explaining the effects of an ECC circuit according to the first embodiment.
Figure 18:
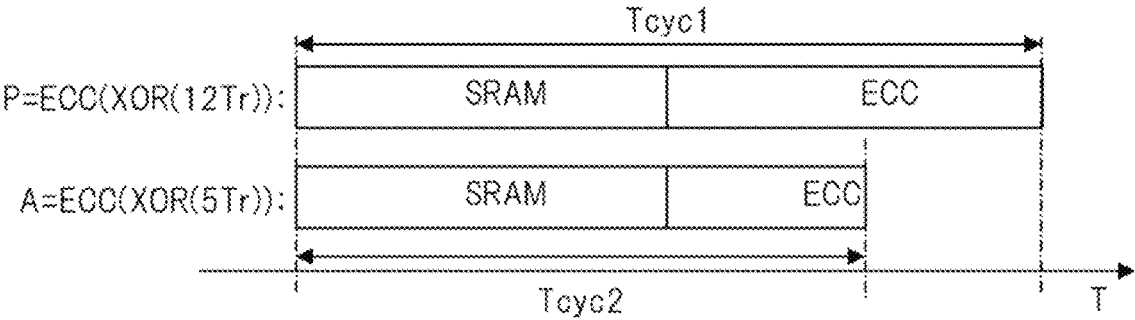
FIG. 18 is a diagram for explaining the effects of an ECC circuit according to the first embodiment.

FIGS. 17 and 18 are diagrams for explaining the effects of the ECC circuit according to the first embodiment. Here, FIG. 17 is a diagram showing the effect of suppressing the increase in occupied area, and FIG. 18 is a diagram showing the acceleration of operation.

In FIG. 17, the horizontal axis indicates the number of gates composed of XOR circuits, and the vertical axis indicates the number of MOS transistors (Tr) required to compose the gates. In the figure, P=XOR(12Tr) indicates the case where the gate is composed using the XOR circuit shown in Patent Document 1. In contrast, A=XOR(5Tr) indicates the case where the gate is composed using the XOR circuit shown in FIG. 5. Furthermore, in FIG. 17, AR=XOR(5Tr)+peripheral circuit indicates the case where MOS transistors composing the peripheral circuit are added to A=XOR(5Tr). In FIG. 17, as indicated by the downward arrows, according to the first embodiment, it is possible to reduce, for example, about 2000 MOS transistors compared to using the XOR circuit shown in Patent Document 1, and it is possible to suppress the increase in occupied area.

FIG. 18 shows the speed of a semiconductor device equipped with an ECC circuit. In FIG. 18, P=ECC(XOT (12Tr)) indicates the operation when the ECC circuit is composed using the XOR circuit shown in Patent Document 1. Also, A=ECC(XOR(5Tr)) indicates the case where the ECC circuit is composed using the XOR circuit shown in FIG. 5, as described in the first embodiment. In FIG. 18, SRAM indicates the time required for the read cycle to read data from memory, and ECC indicates the time for error detection and correction by the ECC circuit on the data read from memory.

As integration advances, for example, memory cells constituting memory become smaller, and the decrease in reliability due to soft errors becomes a problem, making it essential to provide an ECC circuit in semiconductor devices.

However, error detection and correction by the ECC circuit take time, limiting acceleration. That is, for example, in the XOR circuit shown in Patent Document 1, because multiple MOS transistors are connected in series between the power supply voltage VDD (or ground voltage VSS) and the output terminal, the change in voltage at the output terminal becomes slow, slowing down the operation of the ECC circuit. In contrast, in the XOR circuit according to the first embodiment, it is possible to prevent the slowing down of the voltage change at the output terminal, making it possible to speed up the operation of the ECC circuit. Thus, the time of the sum of the memory read cycle time and the time by the ECC circuit operation cycle can be shortened from Tcyc1 to Tcyc2, thereby achieving an increase in speed.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
a semiconductor chip formed with a plurality of circuit blocks,
wherein the plurality of circuit blocks include
a memory;
a first input circuit for outputting a signal;
a first processing circuit including a plurality of logic circuits and processing the signal from the first input circuit; and
a first output circuit for supplying an output of the first processing circuit to the memory,
wherein each of the plurality of logic circuits includes
a first N-type MOS transistor having a first terminal, a second terminal, and a first gate terminal for controlling conduction between the first terminal and the second terminal, a first signal from the first input circuit is supplied to the first terminal, and a second signal from the first input circuit is supplied to the first gate terminal;
a second N-type MOS transistor having a third terminal, a fourth terminal, and a second gate terminal for controlling conduction between the third terminal and the fourth terminal, the second signal is supplied to the third terminal, and the first signal is supplied to the second gate terminal;
an output driver having an input terminal connected to the second terminal of the first N-type MOS transistor and the fourth terminal of the second N-type MOS transistor; and
a first P-type MOS transistor connected between the input terminal of the output driver and a predetermined voltage, precharging the input terminal of the output driver with a voltage based on the predetermined voltage in response to a first trigger signal supplied to the gate terminal,
wherein the output driver of the logic circuit outputs a signal according to a result of a logical operation of the first and second signals after being precharged by the first trigger signal.

2. The semiconductor device according to claim 1,
wherein the plurality of logic circuits include a first logic circuit, a second logic circuit, and a third logic circuit, and
wherein the output of the second logic circuit is supplied as the first signal to the first terminal and the second gate terminal of the first logic circuit, and the output of the third logic circuit being supplied as the second signal to the third terminal and the first gate terminal of the first logic circuit.

3. The semiconductor device according to claim 2,
wherein during a period in which the signal from the first output circuit is being written to the memory, the output drivers in the first logic circuit, the second logic circuit, and the third logic circuit are precharged by the first trigger signal.

4. The semiconductor device according to claim 3,
wherein the plurality of circuit blocks further comprising:
a front-end circuit that supplies signals to the memory and the first input circuit; and
a first control circuit connected to the front-end circuit and the first processing circuit and outputting a timing signal according to the processing of the front-end circuit, wherein the timing signal output from the first control circuit is supplied as the first trigger signal to the gate terminal of the first P-type MOS transistor in the first logic circuit.

5. The semiconductor device according to claim 4,
wherein the timing signal output from the first control circuit is supplied as the first trigger signal to the gate terminals of the first P-type MOS transistors in the second and third logic circuits.

6. The semiconductor device according to claim 5,
wherein the timing signal output from the first control circuit is supplied to the first input circuit and the first output circuit, and the first input circuit and the first output circuit operate according to the timing signal.

7. The semiconductor device according to claim 3,
wherein the plurality of circuit blocks include
a second input circuit to which signals are supplied from the memory;
a second processing circuit that processes signals from the second input circuit and includes multiple logic circuits; and
a second output circuit to which signals are supplied from the second processing circuit,
wherein each of the multiple logic circuits in the second processing circuit includes
a third N-type MOS transistor having a fifth terminal, a sixth terminal, and a third gate terminal that controls conduction between the fifth and sixth terminals, a first signal from the second input circuit is supplied to the fifth terminal, and a second signal from the second input circuit is supplied to the third gate terminal;
a fourth N-type MOS transistor having a seventh terminal, an eighth terminal, and a fourth gate terminal that controls conduction between the seventh and eighth terminals, the second signal from the second input circuit is supplied to the seventh terminal, and the first signal from the second input circuit is supplied to the fourth gate terminal;
an output driver having an input terminal connected to the sixth terminal of the third N-type MOS transistor and the eighth terminal of the fourth N-type MOS transistor; and
a second P-type MOS transistor connected between the input terminal of the output driver and a predetermined voltage, and precharges the input terminal of the output driver with a voltage based on the predetermined voltage in response to a second trigger signal supplied to the gate terminal,
wherein the output driver of the logic circuit in the second processing circuit outputs a signal according to the result of the logical operation of the first and second signals after being precharged by the second trigger signal.

8. The semiconductor device according to claim 7,
wherein the plurality of circuit blocks further includes a second control circuit that is connected to the memory and outputs a timing signal according to a read operation in the memory, and
wherein the timing signal output from the second control circuit is supplied as the second trigger signal to the gate terminal of the second P-type MOS transistor in the logic circuit of the second processing circuit.

9. A semiconductor device comprising:
a semiconductor chip formed with a plurality of circuit blocks,
wherein the plurality of circuit blocks include
a memory;

an input circuit to which signals are supplied from the memory;

a plurality of logic circuits;

a processing circuit that processes signals from the input circuit; and an output circuit to which signals from the processing circuit are supplied, wherein each of the plurality of logic circuits includes a first N-type MOS transistor having a first terminal, a second terminal, and a first gate terminal for controlling conduction between the first terminal and the second terminal, a first signal from the input circuit is supplied to the first terminal, and a second signal from the input circuit is supplied to the first gate terminal;

a second N-type MOS transistor having a third terminal, a fourth terminal, and a second gate terminal that controls conduction between the third terminal and the fourth terminal, the second signal is supplied to the third terminal, and the first signal is supplied to the second gate terminal;

an output driver having an input terminal connected to the second terminal of the first N-type MOS transistor and the fourth terminal of the second N-type MOS transistor; and a P-type MOS transistor connected between the input terminal of the output driver and a predetermined voltage, and precharging the input terminal of the output driver with a voltage based on the predetermined voltage in response to a trigger signal supplied to the gate terminal, wherein the output driver of the logic circuit outputs a signal according to a result of a logical operation of the first signal and the second signal after being precharged by the trigger signal.

10. The semiconductor device according to claim 9, wherein the plurality of logic circuits include a first logic circuit, a second logic circuit, and a third logic circuit, and wherein the output of the second logic circuit is supplied as the first signal to the first terminal and the second gate terminal of the first logic circuit, and the output of the third logic circuit is supplied as the second signal to the third terminal and the first gate terminal of the first logic circuit.

11. The semiconductor device according to claim 10, wherein during a period in which signals are read from the memory, the output drivers in the first logic circuit, the second logic circuit, and the third logic circuit are precharged by the trigger signal.

12. The semiconductor device according to claim 11, wherein the plurality of circuit blocks further comprising:

a control circuit that is connected to the memory and outputs a timing signal according to a read operation in the memory, wherein the timing signal output from the control circuit is supplied as the trigger signal to the gate terminal of the P-type MOS transistor in the first logic circuit.

13. The semiconductor device according to claim 12, wherein the timing signal output from the control circuit is supplied as the trigger signal to the gate terminals of the P-type MOS transistors in the second logic circuit and the third logic circuit.

14. The semiconductor device according to claim 13, wherein the timing signal output from the control circuit is supplied to the input circuit and the output circuit, and the input circuit and the output circuit operate according to the timing signal.

15. A semiconductor device comprising:

a pre-stage circuit for generating signals to be written into a memory;

a processing circuit for processing signals generated by the pre-stage circuit; and a memory into which signals generated by the processing circuit and signals generated by the pre-stage circuit are written, wherein the processing circuit comprises:

multiple first logic circuits to which signals generated by the pre-stage circuit are supplied; and multiple second logic circuits to which signals from the multiple first logic circuits are supplied, wherein each of the multiple first logic circuits includes a first MOS transistor having a first terminal, a second terminal, and a first gate terminal for controlling conduction between the first terminal and the second terminal, and during a processing period, a first signal from the pre-stage circuit is supplied to the first terminal and a second signal from the pre-stage circuit is supplied to the first gate terminal;

a second MOS transistor having a third terminal, a fourth terminal, and a second gate terminal for controlling conduction between the third terminal and the fourth terminal, and during the processing period, the second signal is supplied to the third terminal and the first signal is supplied to the second gate terminal;

a first output driver having an input terminal connected to the second terminal of the first MOS transistor and the fourth terminal of the second MOS transistor; and a third MOS transistor connected between the input terminal of the first output driver and a predetermined first voltage, and precharges the input terminal of the first output driver with a voltage based on the predetermined first voltage during a precharge period before the processing period, wherein each of the multiple second logic circuits includes fourth MOS transistor having a fifth terminal, a sixth terminal, and a third gate terminal for controlling conduction between the fifth terminal and the sixth terminal, the fifth terminal is connected to an output terminal of an output driver of one of the multiple first logic circuits, and the third gate terminal is connected to an output terminal of an output driver of another of the multiple first logic circuits;

a fifth MOS transistor having a seventh terminal, an eighth terminal, and a fourth gate terminal for controlling conduction between the seventh terminal and the eighth terminal, the seventh terminal is connected to an output terminal of the other first logic circuit's output driver, and the fourth gate terminal is connected to an output terminal of the one first logic circuit's output driver;

a second output driver having an input terminal connected to the sixth terminal of the fourth MOS transistor and the eighth terminal of the fifth MOS transistor; and a sixth MOS transistor connected between the input terminal of the second output driver and the predetermined first voltage, and precharges the input terminal of the second output driver with a voltage based on the predetermined first voltage during the precharge period.

16. The semiconductor device according to claim 15, wherein one of the first logic circuits includes a seventh MOS transistor connected between the pre-stage circuit and a first gate terminal of the first MOS transistor; and an eighth MOS transistor connected between the pre-stage circuit and a second gate terminal of the second MOS transistor, wherein during the precharge period, the first gate terminal of the first MOS transistor and the second gate terminal of the second MOS transistor are precharged with a voltage 5 based on a predetermined second voltage, and wherein during the processing period, the second signal is supplied to the first gate terminal of the first MOS transistor via the seventh MOS transistor, and the first signal is supplied to the second gate terminal of the second MOS transistor via the 10 eighth MOS transistor.

* * * * *